(12) United States Patent
Kainou et al.

(10) Patent No.: US 7,164,208 B2
(45) Date of Patent: Jan. 16, 2007

(54) SEMICONDUCTOR DEVICE AND METHOD FOR MANUFACTURING THE SAME

(75) Inventors: Kazuyuki Kainou, Hirakata (JP); Masatoshi Yagoh, Kyoto (JP); Kimihito Kuwabara, Uji (JP); Katsumi Ohtani, Ibaraki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 5 days.

(21) Appl. No.: 11/037,262

(22) Filed: Jan. 19, 2005

(65) Prior Publication Data

US 2005/0167832 A1    Aug. 4, 2005

(30) Foreign Application Priority Data

Jan. 20, 2004   (JP)   ............................. 2004-011842
Nov. 18, 2004   (JP)   ............................. 2004-334198

(51) Int. Cl.
*H01L 23/48* (2006.01)
*H01L 23/52* (2006.01)

(52) U.S. Cl. ..................... 257/780; 257/781; 257/784; 257/775; 257/E23.015; 257/E23.02; 257/E23.023; 257/E23.79; 257/E23.508; 257/E21.509; 257/E21.519

(58) Field of Classification Search ............... 257/750, 257/758, 780–782, 784, 786, 772, 779, 775, 257/E23.015, E23.023, 23.079, E21.508, 257/E21.519; 438/612–618
See application file for complete search history.

(56) References Cited

U.S. PATENT DOCUMENTS 6,181,010 B1 *   1/2001   Nozawa ..................... 257/737

6,313,532 B1   11/2001   Shimoishizaka et al.

(Continued)

FOREIGN PATENT DOCUMENTS

JP         7211722         8/1995

(Continued)

OTHER PUBLICATIONS

Japanese Office Action dated Jul. 4, 2006 with English translation.

*Primary Examiner*—Jasmine Clark
(74) *Attorney, Agent, or Firm*—Stevens, Davis, Miller & Mosher, LLP

(57) ABSTRACT

There is provided a semiconductor device in which the junction strength of land portions and external terminals is increased, the disconnection of the external terminal is surely prevented, and the connection reliability is ensured over an extended period of time. An insulating resin layer which insulates metal wires from one another is formed on a semiconductor element, an end portion of the metal wire is connected to an electrode on the semiconductor element, the other end portion of the metal wire is connected to an external terminal to form a land, the entire surface of the semiconductor element except the connecting portions of the lands is covered with a surface-layer resin layer, and a projection is provided on the top surface of a land portion of at least one of the lands. Because of this, after their soldering, the external terminal holds the perimeter of the projection on the land portion, so that the external terminal can be surely connected to the land portion. As a result, the semiconductor device which ensures their connection reliability over an extended period of time can be obtained.

14 Claims, 25 Drawing Sheets

U.S. PATENT DOCUMENTS

| | | | |
|---|---|---|---|
| 2001/0020737 A1* | 9/2001 | Kwon et al. | 257/678 |
| 2001/0023993 A1* | 9/2001 | Kawashima | 257/780 |
| 2001/0026021 A1* | 10/2001 | Honda | 257/778 |
| 2003/0141603 A1* | 7/2003 | Hashimoto | 257/781 |
| 2003/0214034 A1* | 11/2003 | Abe et al. | 257/737 |

FOREIGN PATENT DOCUMENTS

| | | |
|---|---|---|
| JP | 10209591 | 8/1998 |
| JP | 11054649 | 2/1999 |
| JP | 11145199 | 5/1999 |
| JP | 11297873 | 10/1999 |
| JP | 11354563 | 12/1999 |
| JP | 2002280487 | 9/2002 |

\* cited by examiner

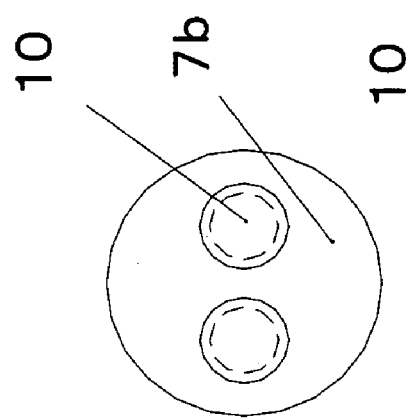
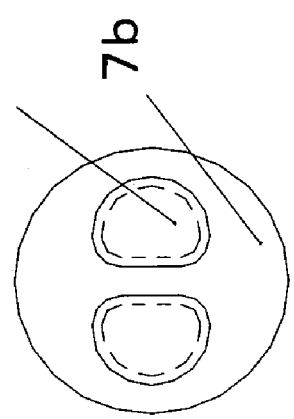
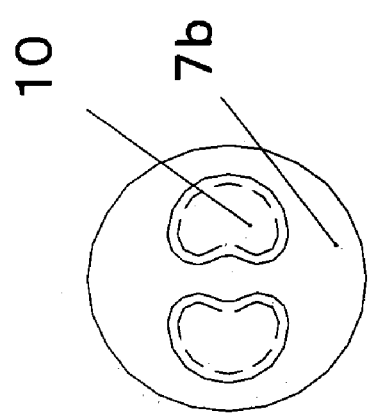
Fig. 6A
Fig. 6B
Fig. 6C

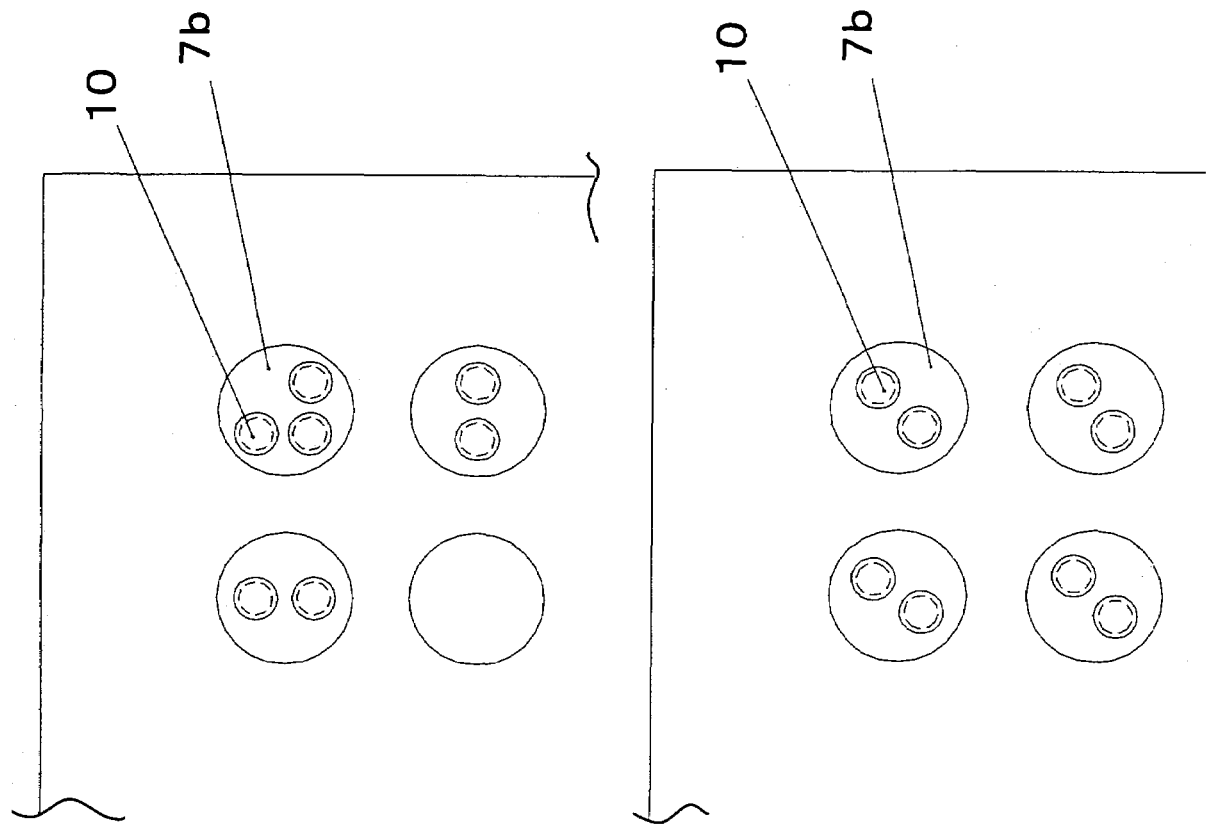

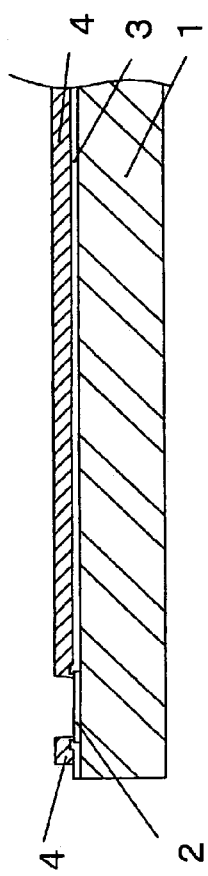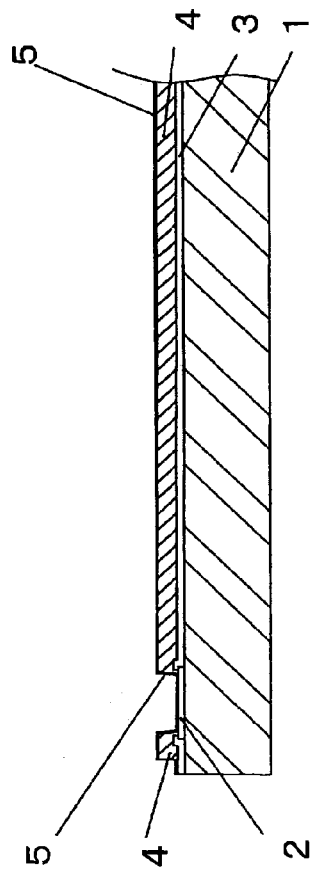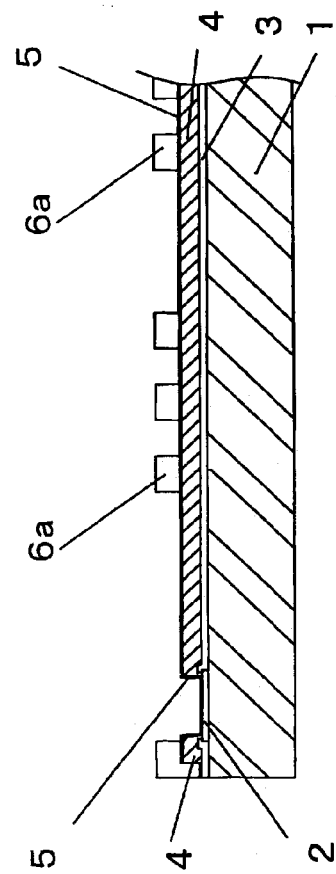
Fig. 12A
Fig. 12B
Fig. 12C

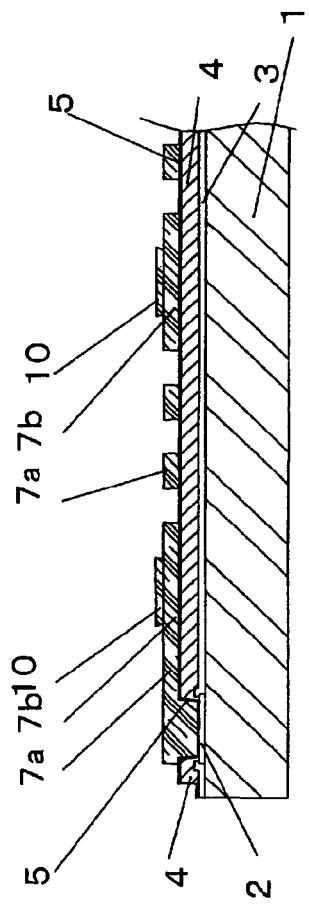
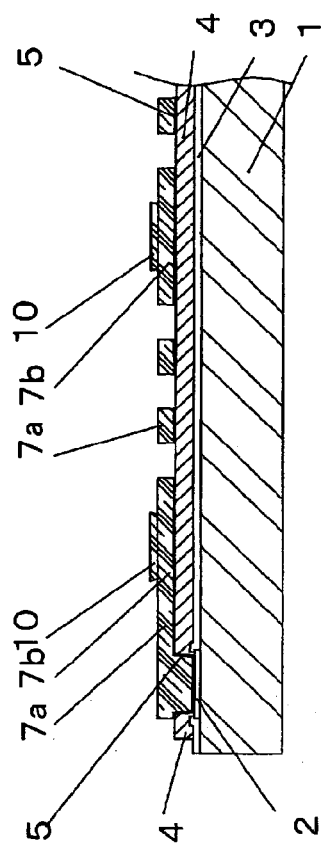
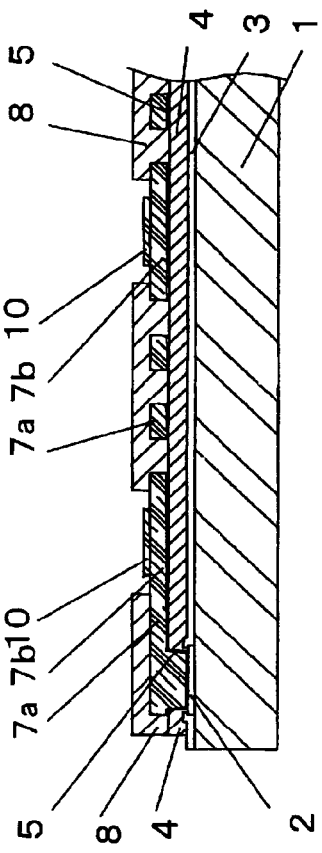
Fig. 14A
Fig. 14B
Fig. 14C

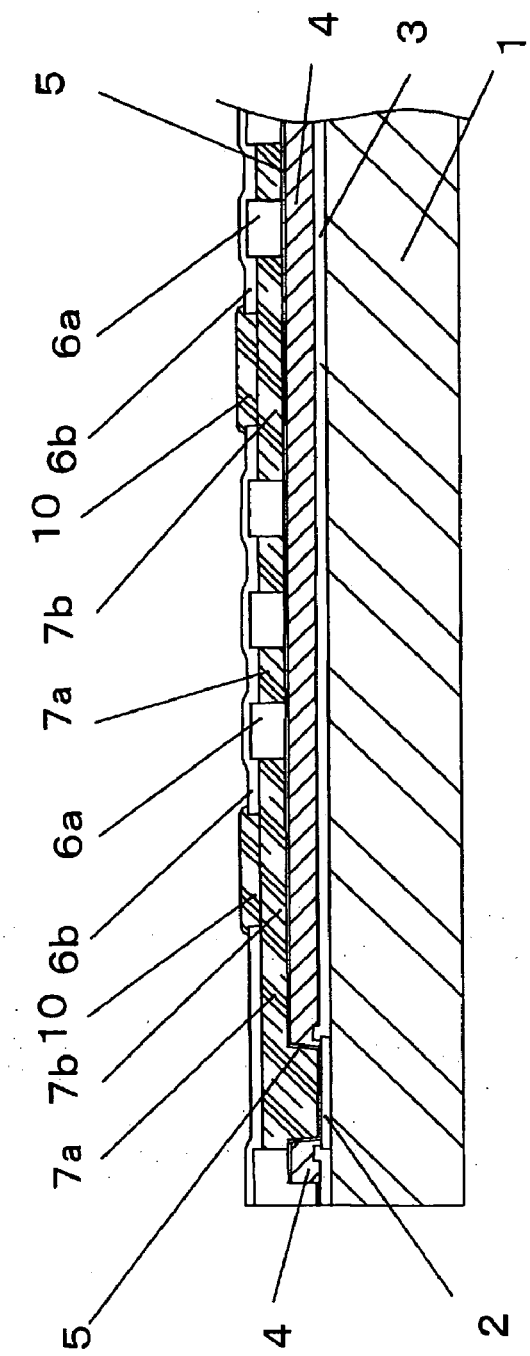
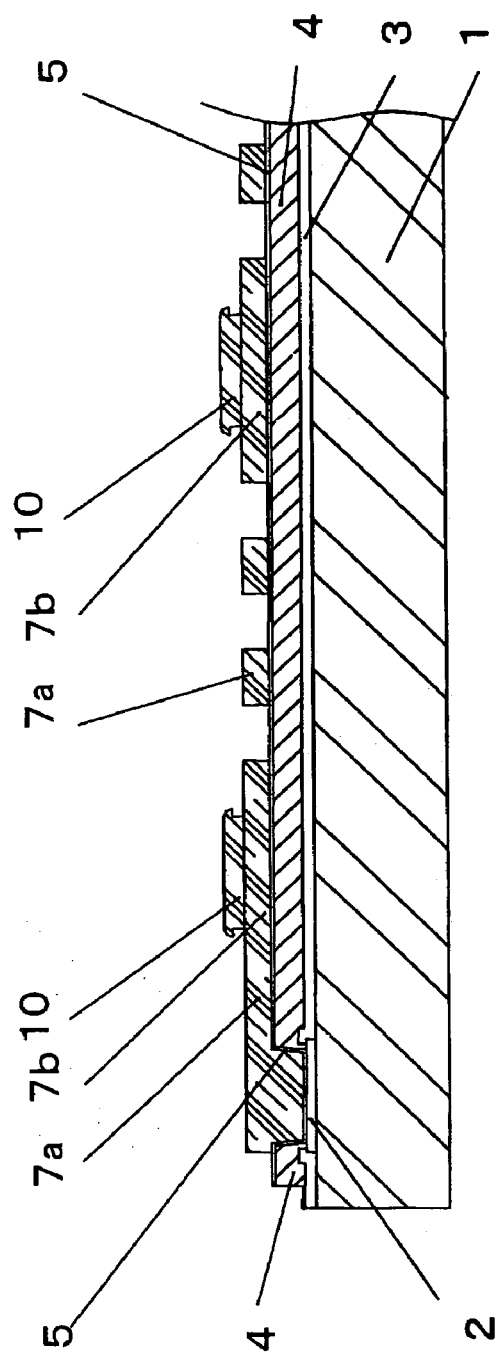
Fig. 18A
Fig. 18B

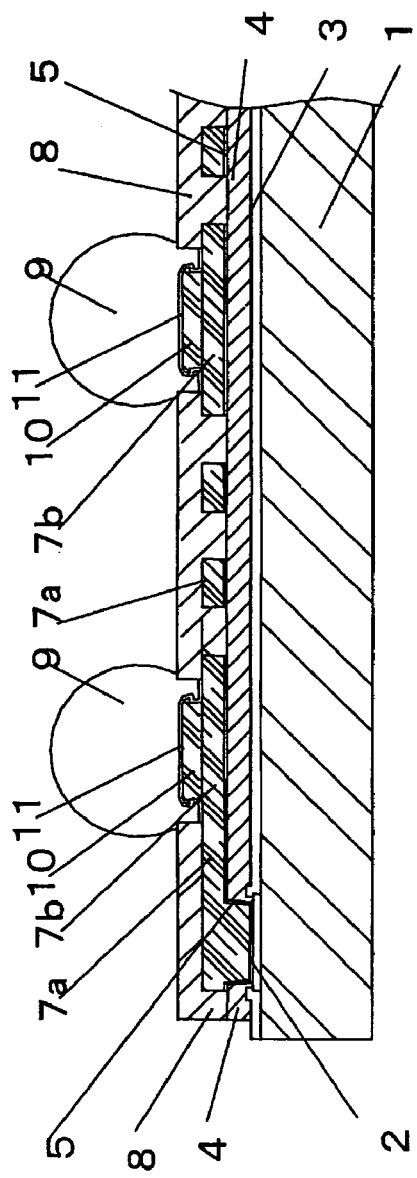
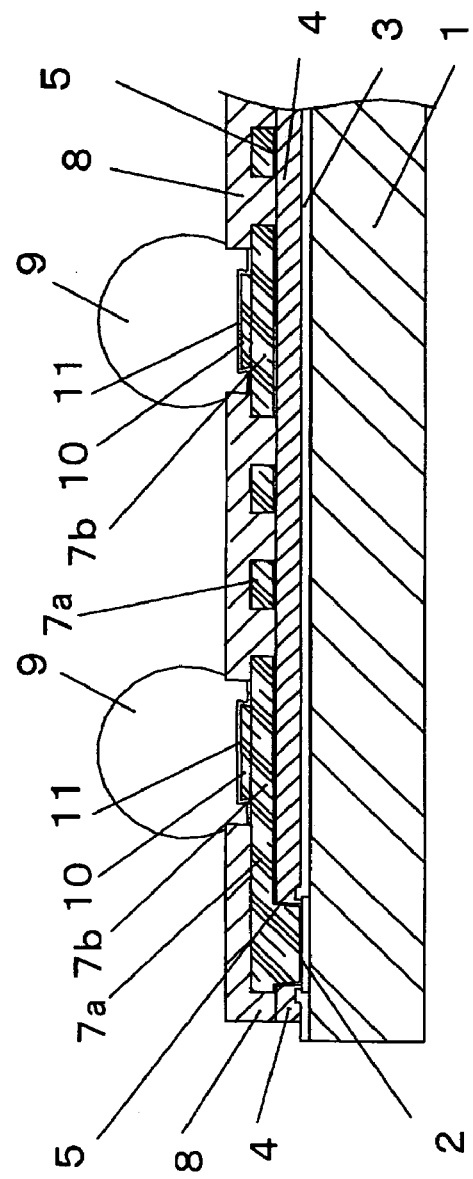
Fig. 19A
Fig. 19B

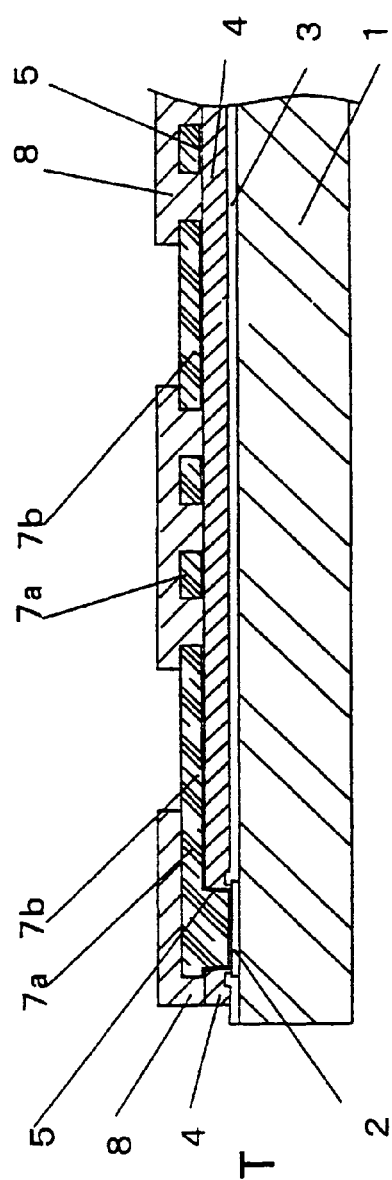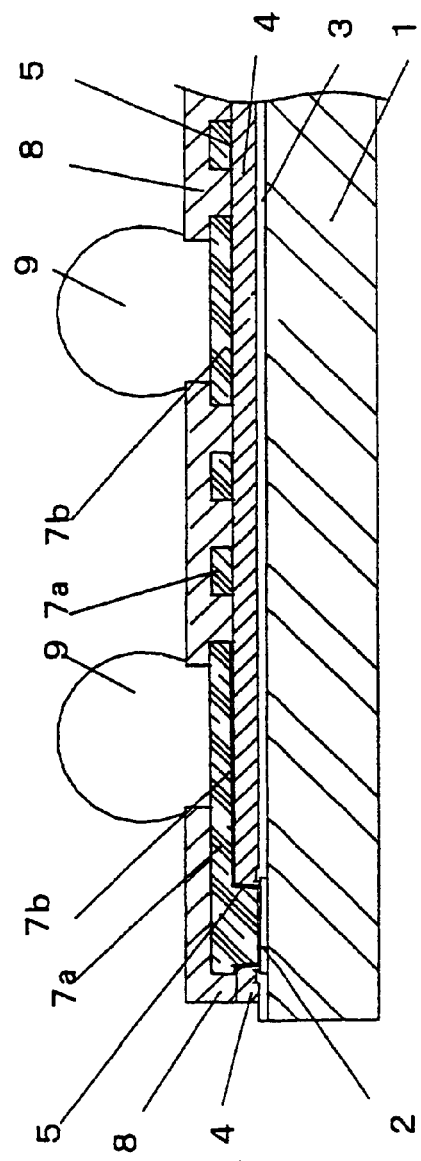
Fig. 23A RELATED ART
Fig. 23B RELATED ART

SEMICONDUCTOR DEVICE AND METHOD FOR MANUFACTURING THE SAME

BACKGROUND OF THE INVENTION

1. Field of the Invention

The present invention relates to a semiconductor device in which semiconductor integrated circuit sections are protected, electric connections of semiconductor elements to external equipment are ensured, external terminals are soldered to a resin substrate for BGAs, wafer-level chip-size packages, and so on, and a high degree of soldering reliability is ensured over an extended period of time, and a method for manufacturing the same.

2. Description of the Related Art

In recent years, electronic components such as semiconductors have been required to have higher packaging densities in order to meet improvements in performance and carryability of electronic gear. In addition, in response to the requirement, progress has been made in fabricating smaller and thinner semiconductor devices having more pins in spite of the same device size, which has brought about the development of BGAs and various CSPs (chip-size packages) having the pins arranged on their area.

In particular, WLCSPs (wafer-level CSPs), in which wiring for connections from semiconductor element electrodes to external terminals on semiconductor wafers is formed, and the wafers are divided in their final manufacturing process, have recently received attention as a technique by which extremely small-sized packages equivalent to bare chips are implemented (see Japanese Patent Laid-Open No. 54649/1999).

In the following, a conventional semiconductor device called "WLCSP" and a method for manufacturing the device will be described with reference to drawings.

FIG. 20 is a partially-opened perspective view showing a semiconductor device called "WLCSP". In FIG. 20, reference numeral 1 denotes a semiconductor element, reference numeral 2 denotes a semiconductor element electrode, reference numeral 3 denotes a passivation film, reference numeral 4 denotes a insulating resin layer, reference numeral 7a denotes a metal wire, reference numeral 7b denotes a metal land, reference numeral 8 denotes a solder resist, and reference numeral 9 denotes an external terminal.

FIGS. 21 to 23 are sectional views showing a conventional method for manufacturing the semiconductor device by manufacturing process. In FIGS. 21 to 23, the same components as those shown in FIG. 20 are denoted by the same reference numerals, and their descriptions are omitted.

First a photosensitive resin is generally used as the insulating resin layer 4, and then applied onto the semiconductor element 1. Thereafter, the photosensitive resin is exposed using an aligner, a stepper, or the like. The photosensitive resin on the semiconductor element electrodes 2 and other portions where no photosensitive resin is required is developed and removed, after which the remaining photosensitive resin is cured to form the resin insulating layer 4 (see FIG. 21A).

In this case, since the semiconductor element electrodes 2 usually comprises Al and Si or Al, Si, and Cu, a weakly alkaline or organic developing solution is used as a developing solution for the photosensitive resin being a material used for forming the resin insulating layer 4 and as a material which does not melt the semiconductor element electrodes 2 during development.

An evaporated metal later 5 is formed on the entire surface of the semiconductor element 1 on which the resin insulating layer 4 is patterned by sputtering (see FIG. 21B). At this time, a metal barrier is first formed as the evaporated metal layer 5, and then, subsequently, a plating seed layer is formed under vacuum. Also, prior to sputtering, the surface of the resin insulating layer 4 is roughened finely by plasma treatment to improve the adhesion strength of the metal barrier to the resin insulating layer 4. It is essential only that methods used for plasma treatment and reactant gases be able to selectively etch the resin of the insulating resin layer 4 in relation to the etching of the semiconductor element electrodes 2 and the passivation film 3; in this case, RIE (Reactive Ion Etching) treatment and $O_2$ gas, $N_2$ gas, or a mixed gas of $O_2$ gas and $CF_4$ gas are used.

As to the metal barrier, a metal, such as Cr, is used which has a strong adhesion strength to the insulating resin layer 4, the semiconductor element electrodes 2, and the passivation film 3 and has barrier properties to the etchant for the plating seed layer. As the plating seed layer, it is necessary for the metal to exhibit a low resistivity during electroplating, so that Cu is generally used. The thickness of the metal barrier used is of the order of 0.1 to 0.2 μm in view of the barrier properties of the seed layer to the etchant, and the thickness of the plating seed layer used is of the order of 0.2 to 0.5 μm in view of electric resistance, deposition stress, and ease of etching. Then, a photosensitive resist material is applied onto the plating seed layer, after which a plating resist 6 is formed by drying, exposing, and developing the photosensitive resist material (see FIG. 21C). In general, the plating resist 6a is formed so as to have a thickness of the order of 8 to 15 μm in order that the thickness of copper-electroplating at a subsequent process may be of the order of 5 to 11 μm. Thereafter, the development residue of the plating resist 6a is removed by plasma treatment using $O_2$ gas.

Then openings are made in the plating resist 6a by copper-electroplating, and a thick-film metal layer 7 is selectively formed on portions where the seed layer is exposed (see FIG. 22A). The thick-film metal layer 7 is formed so as to have a thickness of the order of 5 to 11 μm in view of its electric resistance and mechanical strength.

After the formation of the thick-film metal layer 7, the plating resist 6a is exfoliated. Further, the peel residue of the plating resist 6a is removed by plasma treatment using $O_2$ plasma (see FIG. 22B).

Next, when the entire surface of the seed layer and the thick-film metal layer 7 is etched by a copper etchant, the copper of the seed layer which is thinner than the thick-film metal layer 7 is first removed. At this time, as to the etchant used for etching the seed layer, a solution is used which is capable of selectively etching the seed layer without melting the metal barrier. Then, the metal wires 7a having a desired pattern and the metal lands 7b are formed by etching the entire surface of the metal barrier (see FIG. 22C).

Next, a photosensitive resin is applied onto the resin insulating layer 4 and the thick-film metal layer 7, after which the resin is dried and exposed. Then the photosensitive resin on the metal lands 7b and other portions where no photosensitive resin is required is developed and removed, after which the remaining resin is cured to form the solder resist layer 8 (see FIG. 23A).

Thereafter, a solder paste is print-melted on the metal lands to form the external terminals 9 (see FIG. 23A). At this time, low-melting metal balls may be mount-melted to form the external terminals 9 instead of print-melting the solder paste. Also, Ni—Au plating may be carried out on the metal lands prior to the printing of the solder paste.

According to the conventional method, however, the copper layer, which forms the wires and the lands, is finely roughened as its surface treatment in order to enhance its adhesion to the solder resist, while its entire shape between the metal lands and the external terminals is flat. For this reason, when the external terminals undergo thermal stress resulting from mechanically-applied external force and a difference in their thermal expansions during the inspection process after assembly and packaging process of the semiconductor device and in the state that they are connected to external equipment after the packaging, cracks 13 may occur at the junction interfaces of the lands 7b and the external terminals 9 as shown in FIG. 24, and the disconnection of the external terminals occur on rare occasion. Even when the crack or disconnection does not occur at a single load, long-duration junction reliability may deteriorate due to the formation of the alloy layer at the interface under high temperature atmosphere. At a result, as shown in FIGS. 25A and 25B, there have been obtained a method for increasing junction strength resulting from metallic bond generated at the junction interface 14 of the land portion 7b and the external terminal 9 by increasing the area of the junction interface 14 of the land portions 7b and the external terminals 9. However, in case where the brittle metal layer resulting from metal diffusion is formed at the junction interface 14 by thermal hysteresis, the junction strength is extremely reduced, so that the improvement in the junction strength resulting from the increase in their junction area has not yet brought about a radical solution of the problems of the occurrence of cracks at the junction interface and the disconnection of external terminals.

In recent years, the influence of lead upon environment has become a worldwide problem, so that the conversion of conventional lead-containing Pd—Sn eutectic solder to solder containing no lead (hereinafter referred to as Pd-free solder) has been proceeding at various companies including those in the electric and parts industries. Since the melting point of Pd-free solder is higher than that of Pd—Sn eutectic solder, the set temperature of a reflow process becomes high, so that the metal diffusion has become prone to spread. In fact, the frequency of the occurrence of cracks at the junction interface and the falloff of external terminals has been further increased than in the past.

SUMMARY OF THE INVENTION

It is an object of the present invention to provide a semiconductor device, in which the junction strength of land portions and external terminals can be increased, the falloff of the external terminal can be surely prevented, and their connection reliability can be ensured over an extended period of time, and a method for manufacturing the semiconductor device.

In order to attain the above object, there is provided the semiconductor device of a first invention in which an insulating resin layer, by which metal wires are insulated from one another, is formed on a semiconductor element, the end portion of the metal wire is connected to an electrode on the semiconductor element, the other end portion of the metal wire is connected to an external terminal to from a land, the entire surface of the semiconductor element except the connecting portions of the lands is covered with a surface resin layer, and a projection is provided on the top surface of at least one land portion of the lands.

According to the configuration, when the external terminal is soldered to the land portion, the external terminal catches hold of the perimeter of the projection on the land portion, so that the connection of the external terminal to the land portion can be ensured. As a result, a semiconductor device, in which the connection reliability is ensured over an extended period of time, can be obtained.

The semiconductor device of a second invention is that of the first invention whose projections provided on the top surfaces of the land portions have a shape that at least a part of their upper portion overhangs their upper portion.

According to this shape, the projection has a resistance to the disconnection direction of the external terminal, so that the junction strength of the external terminal to the land portion is increased and, therefore, the disconnection of the external terminal can be surely prevented.

The semiconductor device of a third invention is that of the first invention whose projections provided on the top surfaces of the land portions have a shape that at least a portion of their side has a reverse-tapered shape.

According to this configuration the projection has a resistance to the disconnection direction of the external terminal, so that the connecting strength of the external terminal to the land portion is increased and, therefore, the disconnection of the external terminal can be surely prevented.

The semiconductor device of a fourth invention is that of the second or third invention whose projections provided on the top surfaces of the land portions have a shape that the direction of the length of their top surface is perpendicular to the perimeter of the semiconductor device.

According to this configuration, the projection has a resistance to mechanical external force by aligning the direction of the length of the top surface of the projection with the direction along which mechanical external force acts, so that the connection of each external terminal can be retained.

The semiconductor device of a fifth invention is that of the second or third invention having a shape that the direction of the length of the top surface of the projection provided on the top surface of the land portion radiates from the center of the top surface of the semiconductor device.

According to this shape, the projection has a resistance to thermal stress by aligning the direction of the length of its top surface with the direction along which the thermal stress acts, so that the connection of each external terminal can be retained.

The semiconductor device of a sixth invention is that of the second or third invention in which the projection provided on the top surface of at least one of the lands placed on the diagonal lines of the semiconductor device has a cross-shaped or L-shaped top surface having two directions of its length which are perpendicular to the perimeter of the semiconductor device.

According to this configuration, the projections have a resistance to mechanical external force from the two directions by aligning the direction of the length of their top surface with the two directions along which mechanical external force acts in the vicinity of the corners of the semiconductor device, so that the connection of each external terminals can be retained.

The semiconductor device of a seventh invention is that of the second or third invention in which the lands are positioned in plural lines inside of the vicinity of the perimeter of the semiconductor device, the projection is provided on the top surface of the land portions positioned in at least a first line from the outermost line, and no projection is provided on the land portions positioned in at least a first line from the inmost line.

According to this configuration, the connection of each external terminal can be retained by placing the projections in order to resist thermal stress resulting from difference in thermal expansions which becomes larger as the distance between the projections and the center of the top surface of the semiconductor device becomes longer.

The semiconductor device of a eighth invention is that of the second or third invention in which the direction of the length of the top surface of the projections becomes perpendicular to the perimeter of the semiconductor device by arranging the plural projections on the land portion.

The semiconductor device of a ninth invention is that of the second or third invention in which the direction of the length of the top surface of the projections radiates from the center of the top surface of the semiconductor device by arranging the plural projections on the top surface of the land portion.

The semiconductor device of a tenth invention is that of the second or third invention in which the direction of the length of the top surface of the projection provided on the top surface of the land portions is perpendicular to the perimeter of the semiconductor device, and the short width of the top surface of the projection varies partway.

The semiconductor device of a eleventh invention is that of the second or third invention in which the direction of the length of the top surface of the projection provided on the top surface of the land portions radiates from the center of the top surface of the semiconductor device, and the short width of the top surface of the projection varies partway.

According to the configurations of the eighth to eleventh inventions, the area of the projections which offers a resistance to the direction of the external terminal disconnection is increased, and the junction strength of the external terminals to the land portions is therefore increased, so that the disconnection can be prevented.

The semiconductor device of a twelfth invention is that of the second or third invention in which the two directions of the length of the cross-shaped top surface of the projection provided on the top surface of the land portions are perpendicular to the perimeter of the semiconductor device respectively, and the short width of the top surface of the projection varies partway.

According to this configuration, the projection offers a resistance to mechanical external forces from the two directions by aligning the two directions of the length of the top surface of the projector with the two directions along which the mechanical external forces act in the vicinity of the corners respectively, and the area of the projection which offers a resistance to the disconnection direction of the external terminal is increased, so that the junction strength of the external terminal to the land portion is increased and the disconnection can be therefore prevented.

The semiconductor device of a thirteenth invention is that of the second or third invention in which many directions of the length of the top surface of the projection provided on the top surface of the land portions radiate, and the short widths of the top surface of the projection vary partway.

According to this configuration, the top surface of the projection has no orientation. Because of this, the projection can be placed irrespective of the position of the land in the semiconductor device, and the area of the projection which offers a resistance to the disconnection direction of the external terminal can be increased, so that the connecting strength of the external terminal to the land portion is increased and the disconnection can be therefore prevented.

The semiconductor device of a fourteenth invention is that of the second or third invention in which the projection provided on the top surface of the land portion has a top surface whose corners are chamfered. The corner is chamfered so as to have angles of 120° or more or is rounded.

According to this configuration, stress concentration to the external terminals is relieved, so that their cracks and disconnection can be prevented.

The semiconductor device of a fifteenth invention is that of the second or third invention in which the top surface of the projection provided on the top surface of the land portion does not lie off or make contact with the perimeter of the land portion or the resist opening on the land portion, that is, the projection is formed inside the perimeter of the land portion or the resist opening on the land portion.

According to this configuration, since the projection is surrounded with a material of which the external terminal, that is, since the material of which the external terminal is made holds the perimeter of the projection, the deformation and cracks of the external terminal which start from the projection can be prevented, so that the disconnection of the external terminal can be prevented.

The method for manufacturing a semiconductor device of a sixteenth invention is as follows: an insulating resin layer which insulates metal wires from one another is formed on a semiconductor element; the end portion of the metal wire is connected to an electrode on the semiconductor device; and the other end portion of the metal wires is connected to an external terminal to form a land. Further, a plating resist having openings which have a forward-tapered side is formed on at least one of the lands, and projections having a reverse-tapered side are formed in the openings respectively by electroplating.

According to this configuration, since the projection on the land portion can be formed so as to have a reverse-tapered side, the projection has a resistance to the disconnection direction of the external terminal, so that the connecting strength of the external terminal to the land portion is increased and its disconnection can be therefore surely prevented.

The method for manufacturing a semiconductor device of a seventeenth invention is as follows: an insulating resin layer which insulates metal wires from one another is formed on a semiconductor element; an end portion of the metal wire is connected to an electrode on the semiconductor element; and the other end portion of the metal wire is connected to an external terminal to form a land. Further, a plating resist having openings is formed on at least one of the lands, and a metal is deposited in the opening by electroplating to the extent that the metal becomes thicker than the plating resist, thereby a projection having a shape that at least a part of its upper portion overhangs its lower portion is formed.

According to this configuration, since the projection on the land portion can be formed so as to have a shape that its upper portion overhangs its lower portion, the projection has a resistance to the disconnection direction of the external terminal, so that the connecting strength of the external terminal to the land portion is increased, and its disconnection can be therefore surely prevented.

The method for manufacturing a semiconductor device of a eighteenth invention is as follows: an insulating resin layer which insulates metal wires from one another is formed on a semiconductor element; an end portion of the metal wire is connected to an electrode on the semiconductor element; and the other end portion of the metal wire is connected to an external terminal to form a land. At the process of forming the resin film, a resin projection having a reverse-tapered side is formed on the resin of at least a part of the resin portions corresponding to the land portions, and by forming a land portion on the resin projection at the metal deposition and plating process for forming the metal wires, a projection is partly formed in the land portion.

According to this configuration, the metal is deposited along the shape of the resin projection by plating to form the projection on the land portion, so that the external terminal can be surely connected to the land portion.

BRIEF DESCRIPTION OF THE DRAWINGS

FIGS. 6A to 6C are plan views each showing projections on a land according to a sixth embodiment of the invention prior to external terminal mounting.

FIGS. 7A and 7B are plan views each showing a corner portion of the semiconductor device according to the sixth embodiment of the invention prior to external terminal mounting.

FIGS. 12A to 12C are sectional views showing an embodiment of a method for manufacturing a semiconductor device of the invention by manufacturing process.

FIGS. 14A to 14C are sectional views showing an embodiment of a method for manufacturing a semiconductor device of the invention by manufacturing process.

FIGS. 18A and 18B are sectional views showing a variation of the embodiment of a method for manufacturing a semiconductor device of the invention by manufacturing process.

FIGS. 19A and 19B are sectional views each showing a semiconductor device according to a variation of the embodiments of a method for manufacturing a semiconductor device of the invention.

FIGS. 23A and 23B are sectional views showing a conventional semiconductor device by manufacturing process.

DESCRIPTION OF THE PREFERRED EMBODIMENTS

By taking a WLCSP as an example, embodiments of the invention will be described below with reference to the drawings.

Figure 1:
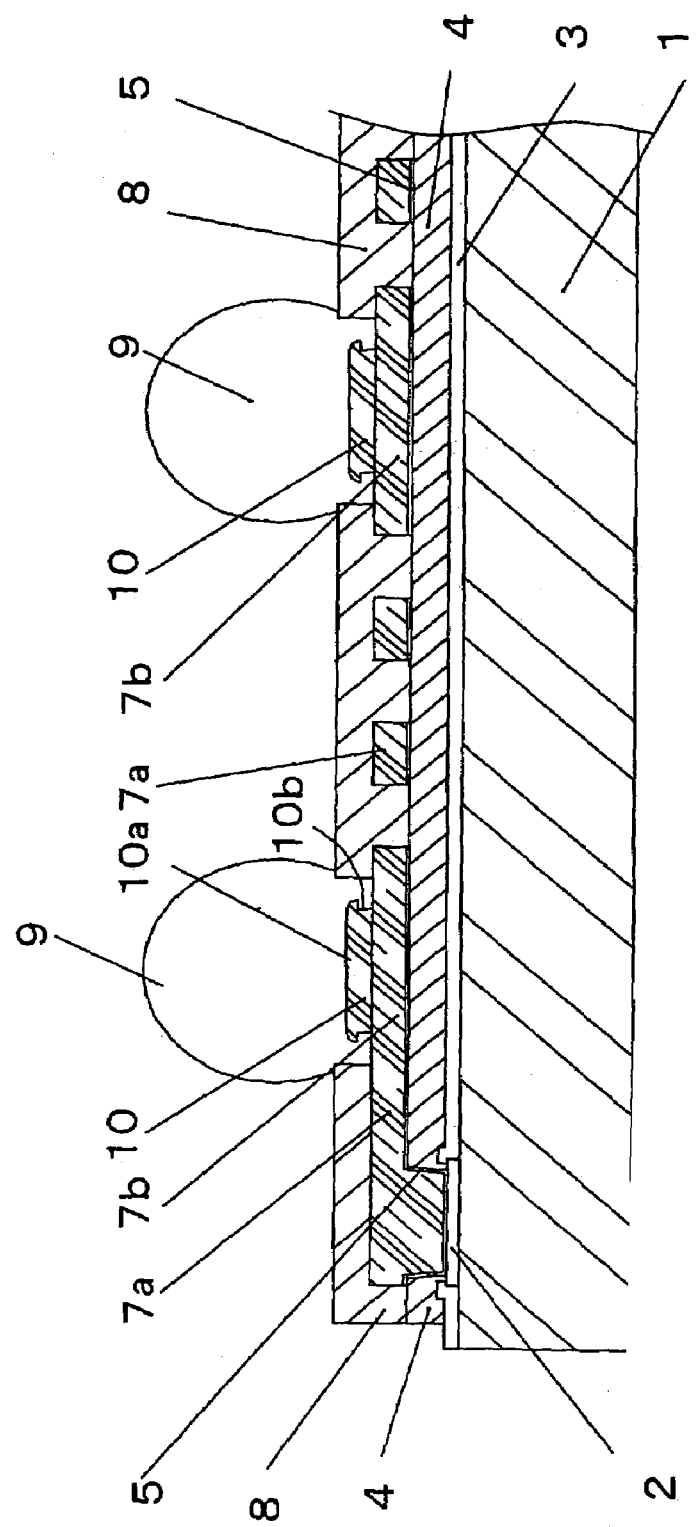
FIG. 1 is a sectional view of a semiconductor device according to a first embodiment of the invention.

The first embodiment of the invention will be described with reference to FIG. 1. FIG. 1 is the sectional view of a semiconductor device according to the first embodiment of the invention.

Figure 20:
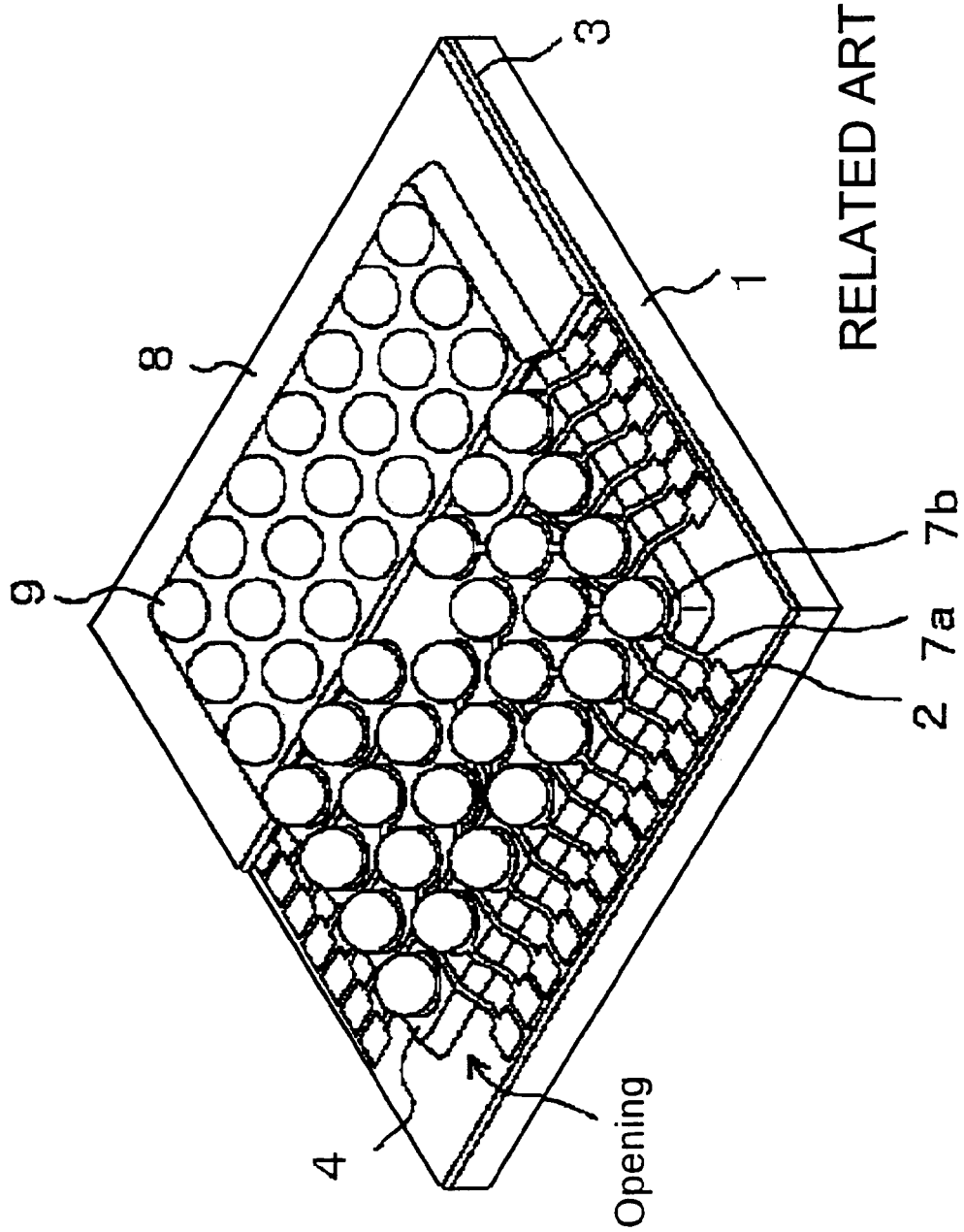
FIG. 20 is a partially-opened perspective view of a semiconductor device of the invention.
Figure 21A:
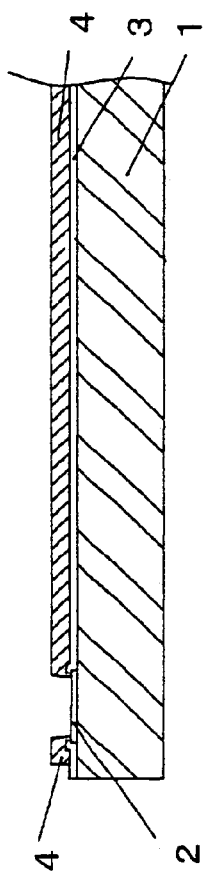
FIGS. 21A to 21C are sectional views showing a conventional semiconductor device by manufacturing process.
Figure 21B:
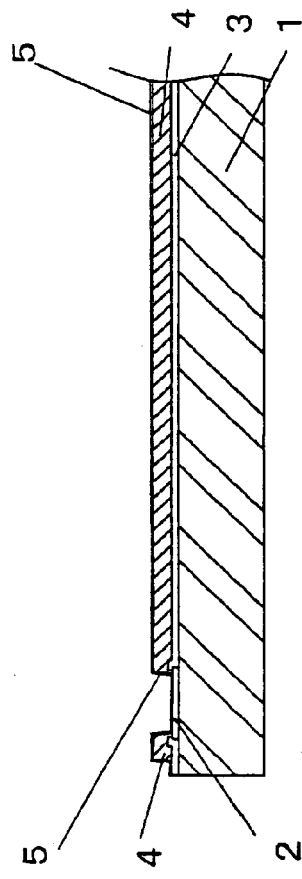
Figure 21C:
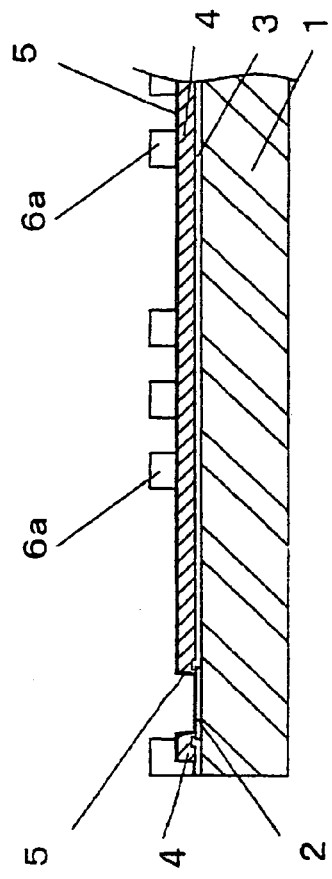
Figure 22A:
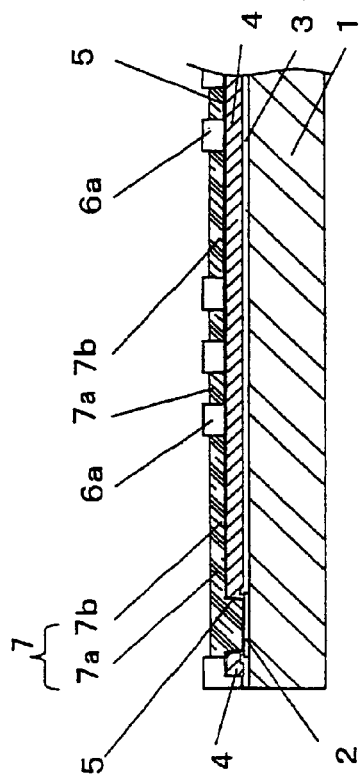
FIGS. 22A to 22C are sectional views showing a conventional semiconductor device by manufacturing process.
Figure 22B:
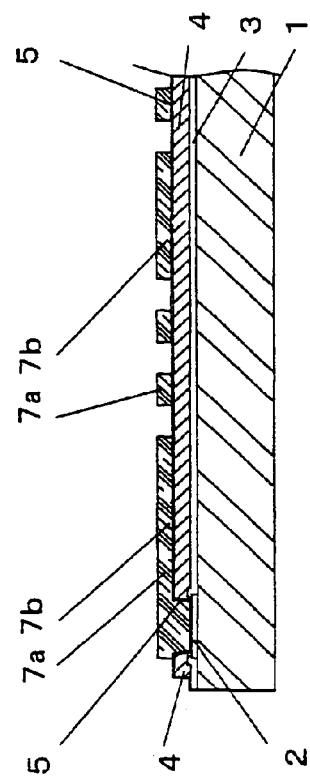
Figure 22C:
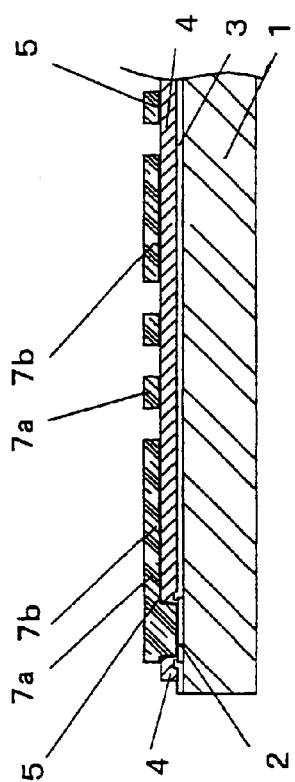
Figure 24:
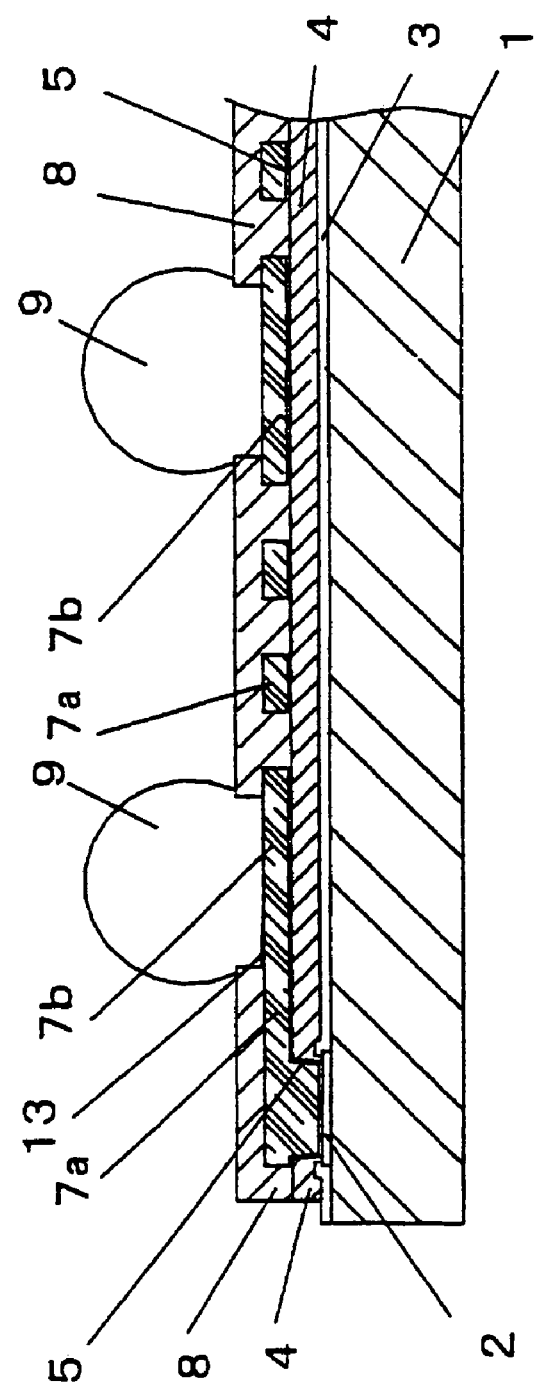
FIG. 24 is a sectional view showing cracks at land junction interfaces of a conventional semiconductor device after its inspection process.
Figure 25A:
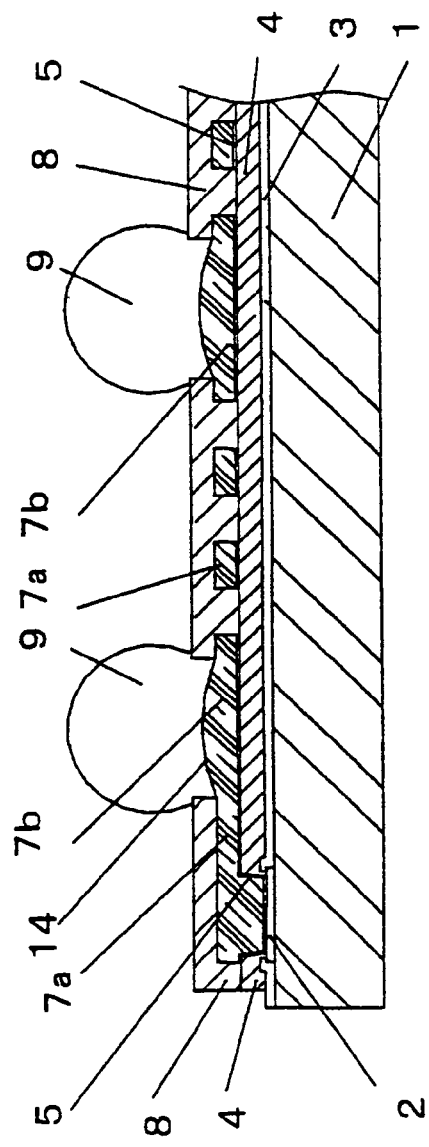
FIGS. 25A and 25B are sectional views each showing land portions having an increased junction area of a conventional semiconductor device.
Figure 25B:
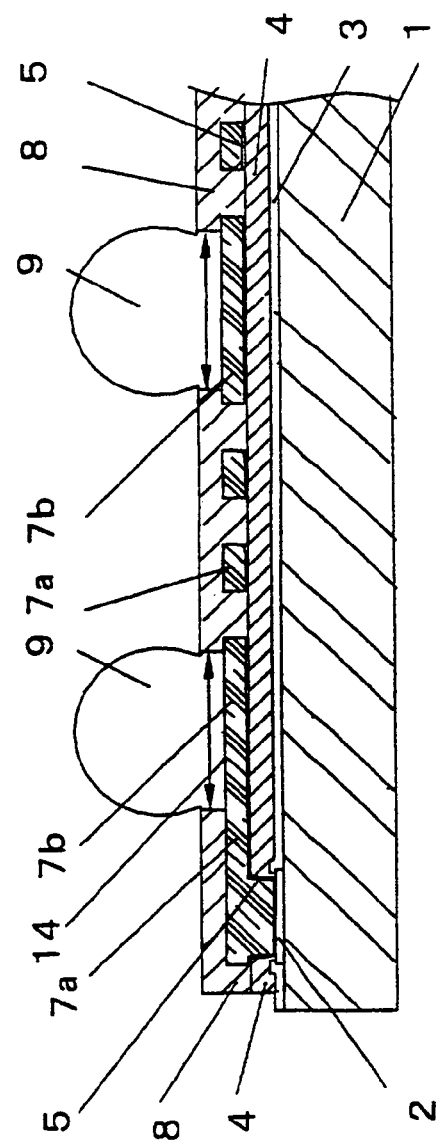

In FIG. 1, the same components as those shown in FIG. 20 are denoted by the same reference numerals, and their descriptions are omitted. As shown in FIG. 1, a resin insulating layer 4, which isolates metal wires 7a from one another, is formed on a semiconductor element 1, an end portion of the metal wires 7a is connected to an electrode 2 on the semiconductor element 1, the other end portions of the metal wires 7a are connected to an external terminal 9 to form a land, and the metal wires are covered with a resin surface layer 8 with the exception of those connected to the lands. Further, a projection 10 is provided on the top surface of at least one land portion 7b of the lands. In this case, the upper portion 10a of the projection on the land portion 7b is formed so as to overhang its lower portion 10b.

The projection 10 is formed by depositing a metal such as copper through plating, that is, by depositing the metal through plating to the extent that the projection 10 becomes thicker than a second-layer plating resist 6b (see FIG. 18). In case where the overhang is formed almost around the periphery of the projection 10, even the formation of the overhang having a width of 0.2 μm or more and the projection having a thickness of about 0.5 μm is effective. However, by the overhang of the projection 10, solder paste does not get into the junction portion at the connection process of the external terminal 9, and therefore voids occurs in solder paste. For the this reason contact reliability deteriorates. To prevent outbreak of voids, it is preferable that the ratio of the width to the height of the projection 10 be 1 or less.

According to this embodiment, when the external terminal are soldered onto the land portion, the overhang portion is snagged on the external terminal by forming a portion of the projection on the land portion so as to have a shape that its upper portion overhangs its lower portion, so that it is possible to structurally prevent the disconnection of the external terminal.

Figure 2:
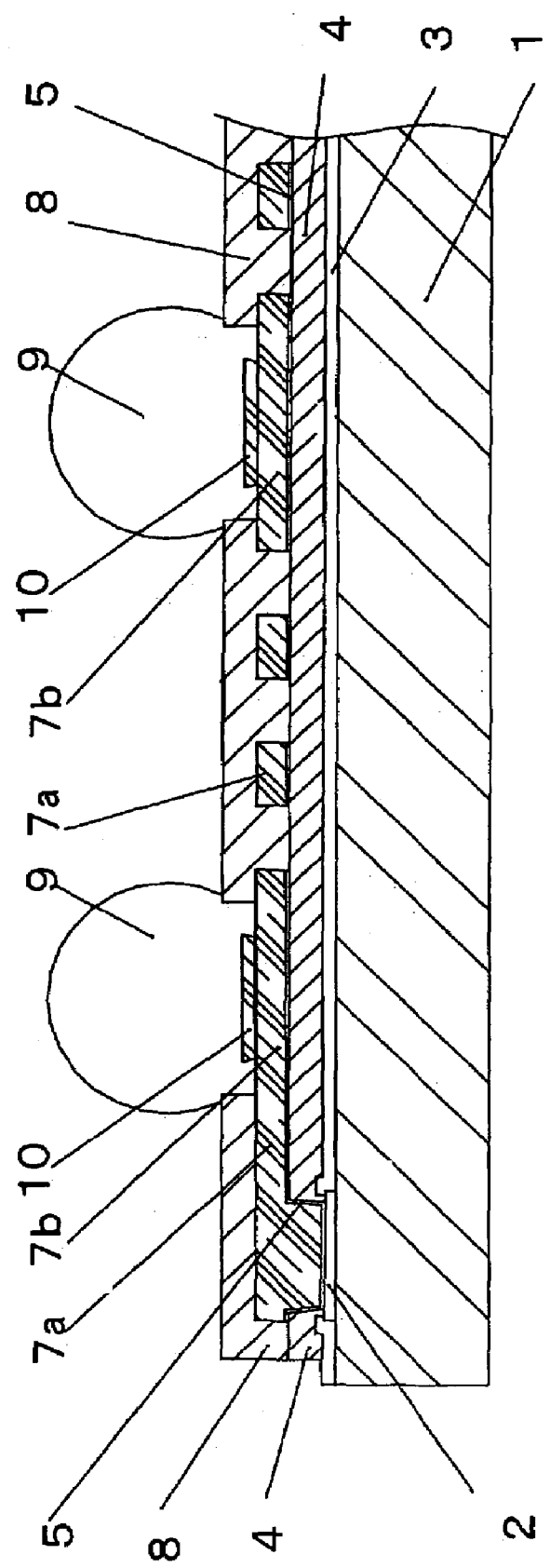
FIG. 2 is a sectional view of a semiconductor device according to a second embodiment of the invention.

The second embodiment of the invention will be described with reference to FIG. 2. FIG. 2 is the sectional view of a semiconductor device according to the second embodiment of the invention.

In FIG. 2, the same components as those shown in FIG. 1 are denoted by the same reference numerals, and their descriptions are omitted. As shown in FIG. 2, a portion of the periphery of the projection 10 on the land portion 7b is formed so as to have a reverse-tapered (undercut) shape. In case where almost all the periphery of the projection 10 is given the reverse-tapered shape, it is effective to form the projection having a thickness of 0.5 to 2 μm and a reverse-tapered shape angled at about 15° to about 30°.

Figure 3:
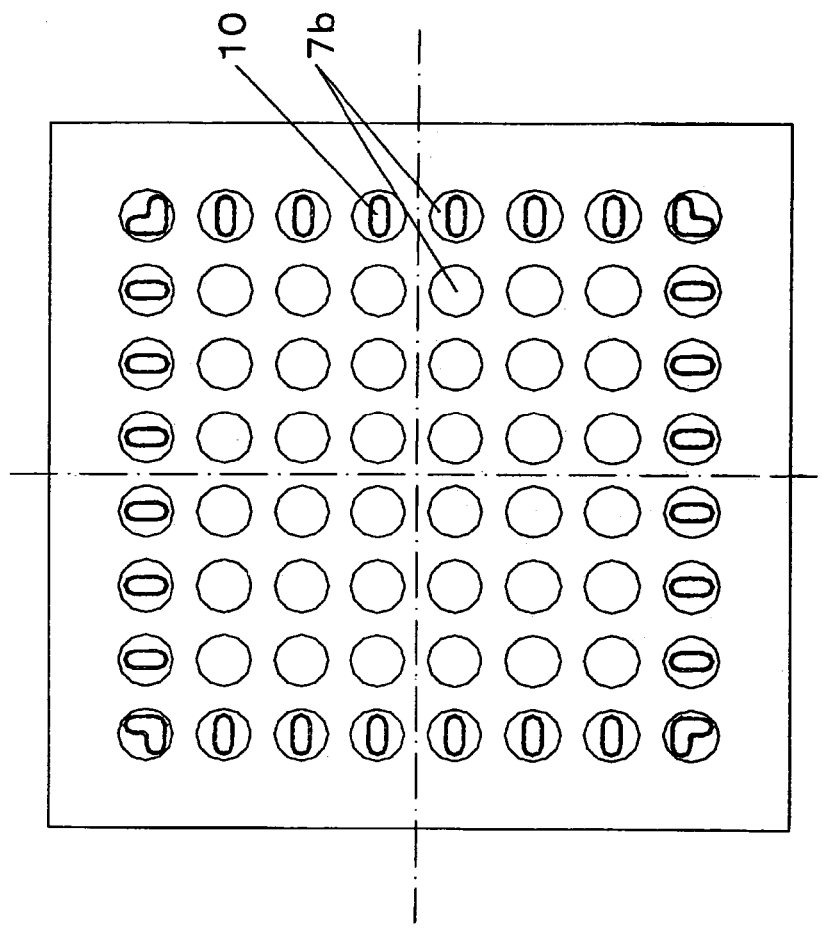
FIG. 3 is a plan view showing a semiconductor device according to a third embodiment of the invention prior to external terminal mounting.

The third embodiment of the invention will be described with reference to FIG. 3. FIG. 3 is the plan view showing a semiconductor device according to the third embodiment of the invention prior to external terminal mounting.

In FIG. 3, the same components as those shown in FIG. 1 are denoted by the same reference numerals, and their descriptions are omitted. As shown in FIG. 3, the projections 10 on the land portions 7b in most outer line are formed so as to have a top surface whose lengthwise direction is perpendicular to the perimeter of the semiconductor device. Also, the projection 10 on the land portion provided on the four corners of the semiconductor device is formed so as to have a L-shaped top surface in which two directions of its length are perpendicular to the perimeter of the semiconductor device respectively. The reason why this arrangement is adopted is that mechanical external force often acts on the outermost external terminals from the side directions of the semiconductor device at its inspection process after assembly and packaging process. Consequently, each corner external terminal is required to resist mechanical external force from the two directions, so that it is preferable that the projections 10 on the corner lands have a L-shaped or cross-shaped top surface.

The lands are positioned in plural lines inside the vicinity of the perimeter of the semiconductor device, so that the projection may be provided on the top surface of the land portions positioned in at least a first line from the outermost line, and no projection may be provided on the land portions positioned in at least a first line from the inmost line.

Figure 4:
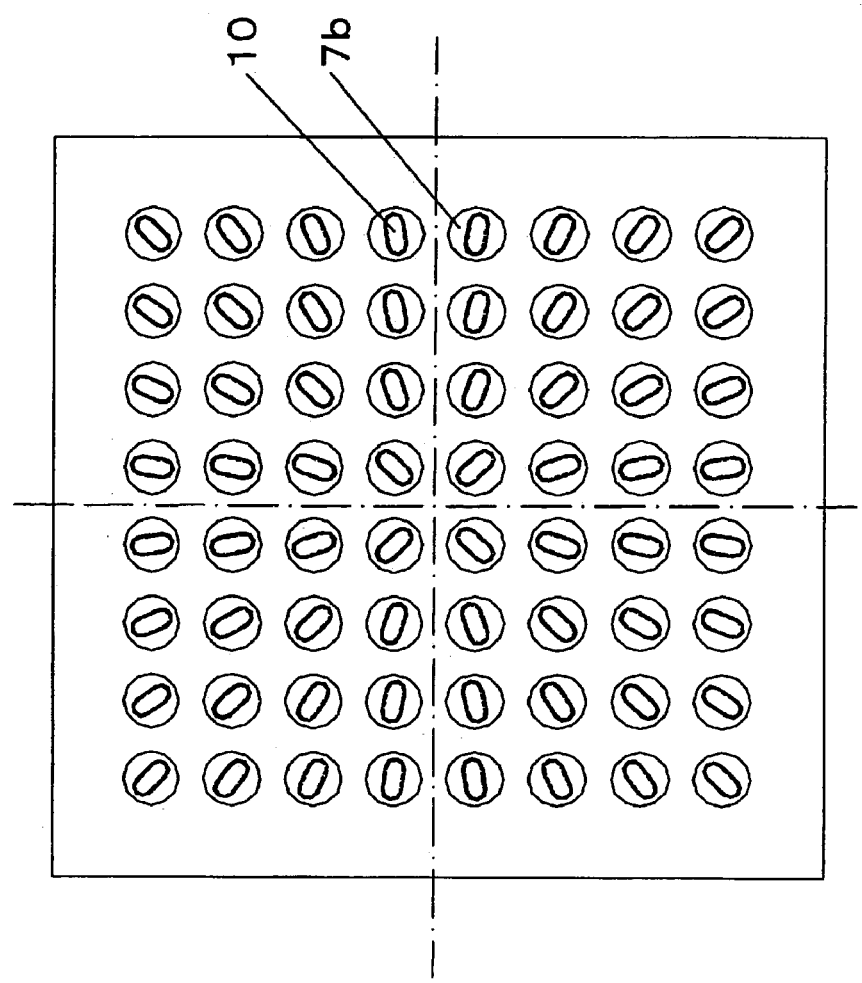
FIG. 4 is a plan view showing a semiconductor device according to a fourth embodiment of the invention prior to external terminal mounting.

The fourth embodiment of the invention will be described with reference to FIG. 4. FIG. 4 is a plan view showing a semiconductor view according to the fourth embodiment of the invention prior to external terminal mounting.

In FIG. 4, the same components as those shown in FIG. 1 are denoted by the same reference numerals, and their descriptions are omitted. As shown in FIG. 4, each projection 10 on each land portion 7b is formed so as to have a shape that the direction of the length of its top surface radiates from the center of the top surface of the semiconductor device. The reason why this arrangement is adopted is that it is considered that thermal stress resulting from the difference in thermal expansions of the various portions of the semiconductor device acts on external terminals other than outermost external terminals at its inspection process after assembly and packaging process and at the state that it is connected to external equipment after packaging, the difference in the thermal expansions becomes zero at the center of the top surface of the semiconductor device, the difference becomes greater as the distances of the external terminals and the center of the top surface of the semiconductor device becomes longer, and the direction of the thermal stress generated radiates from the center of the top surface of the semiconductor device.

Figure 5:
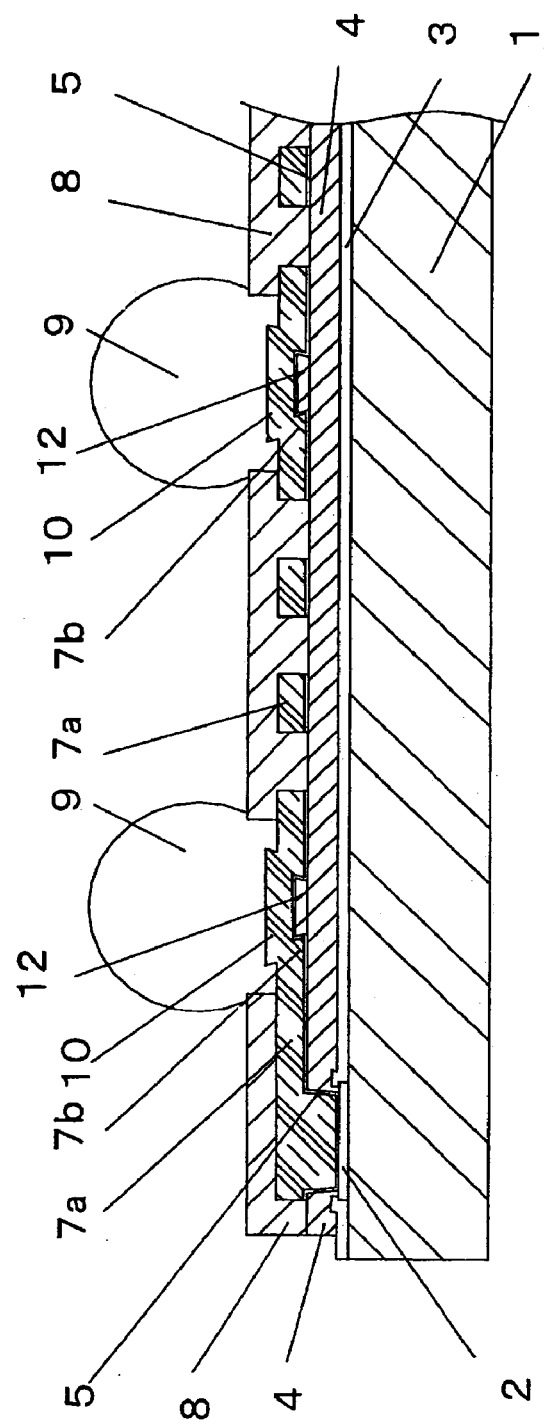
FIG. 5 is a sectional view of a semiconductor device according to a fifth embodiment of the invention.

The fifth embodiment of the invention will be described with reference to FIG. 5. FIG. 5 is the sectional view of a semiconductor device according to the fifth embodiment of the invention.

In FIG. 5, the same components as those shown in FIG. 1 are denoted by the same reference numerals, and their descriptions are omitted. As shown in FIG. 5, resin projections 12 are formed under land portions 7b, a metal is deposited along the shape of the resin projection through plating to form projections 10. At this time, a portion of the periphery of the projection 10 is formed so as to have a reverse-tapered (undercut) shape. In case where almost all the periphery of the projection 10 is given the reverse-tapered shape, it is effective to form the projection 10 having a thickness of 0.5 to 2 μm and a reverse-tapered shape angled at about 15° to about 30°. The formation of the resin projections 12 also brings about the same effect as those of the first and second embodiments since the metal projections 10 are formed on the land portions 7b as in the cases of the first and second embodiments.

FIG. 6 to 11 illustrates other embodiments of the projection on the land. Projections 10 shown in FIGS. 6A to 6C as a sixth embodiment are formed by dividing the oval projections shown in FIG. 3 in the direction of their length. The direction in their length is made by arranging the divided projections 10 on the top surface of a land portion 7b. In this case, the projections 10 are divided into equal halves respectively. In FIG. 6A, each projection divided has a circular top surface. In FIG. 6B, the flat sides of both projections are substantially in parallel with each other. In FIG. 6C, each flat side shown in FIG. 6B have a depression. As a result, the area of the top surface, which has resistance to the direction of external terminal disconnection, is increased, and the junction strength of the land portion 7b and the external terminal is increased, so that the external terminal disconnection can be prevented. At this time, the projections on the land portions located in the outermost corners have arrangements shown in FIGS. 7A and 7B, so that the projections have the same orientation as that of the single oval projection shown in FIGS. 3 and 4. That is, in FIG. 7A, the projections 10 provided on the land portions 7b located at the four corners have an L-shaped arrangement that the two directions of their length are perpendicular to the perimeter of the semiconductor device respectively. In FIG. 7B, the projections 10 on the land portions 7b located at four corners have an arrangement that the direction of their length radiates from the center of the plan view of the semiconductor device.

Figure 8:
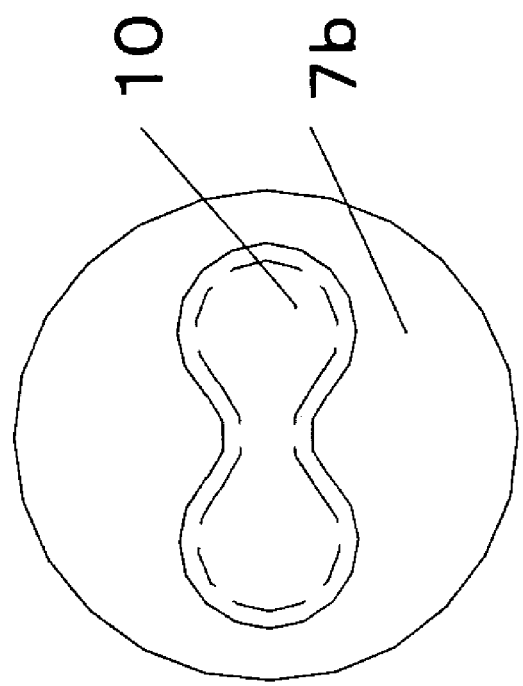
FIG. 8 is a plan view showing a projection on a land according to a seventh embodiment of the invention prior to external terminal mounting.
Figure 9:
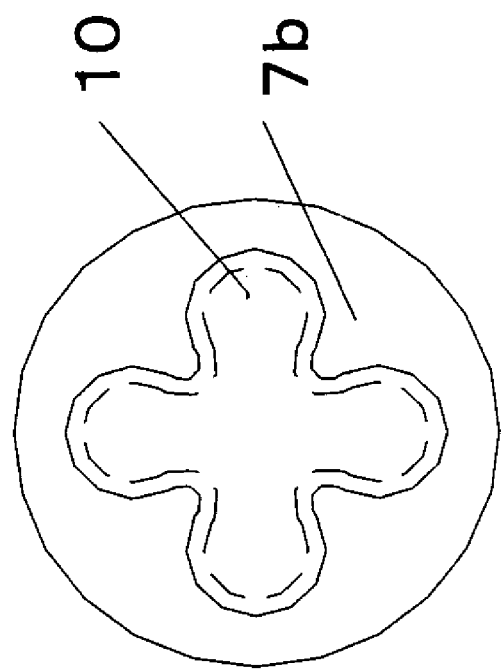
FIG. 9 is a plan view showing a projection on a land according to an eighth embodiment of the invention prior to external terminal mounting.

A projection 10 shown in FIG. 8 as the seventh embodiment is formed so as to have a shape that the width of its top surface (the length of the short sides of the top surface) varies partway. As a result, the area of the top surface, which has resistance to the direction of external terminal disconnection, is increased, and the junction strength of the land portion 7b and the external terminal is increased, so that the external terminal disconnection can be prevented.

A projection 10 shown in FIG. 8 as the seventh embodiment has a cross-shaped top surface having two directions of its length which are each perpendicular to the periphery of the semiconductor device which is in proximity to the land portion 7b, and the width of its top surface (the length of the short sides of the top surface) varies partway. As a result, by aligning the directions of the length of the top surface of the projection 10 with two directions along which mechanical external force is applied in the vicinity of the corners respectively, resistance to the mechanical external force from the two directions is made. In addition, the area of the top surface, which has resistance to the direction of external terminal disconnection, is increased, and the junction strength of the land portion 7b and the external terminal is increased, so that the external terminal disconnection can be prevented.

Figure 10:
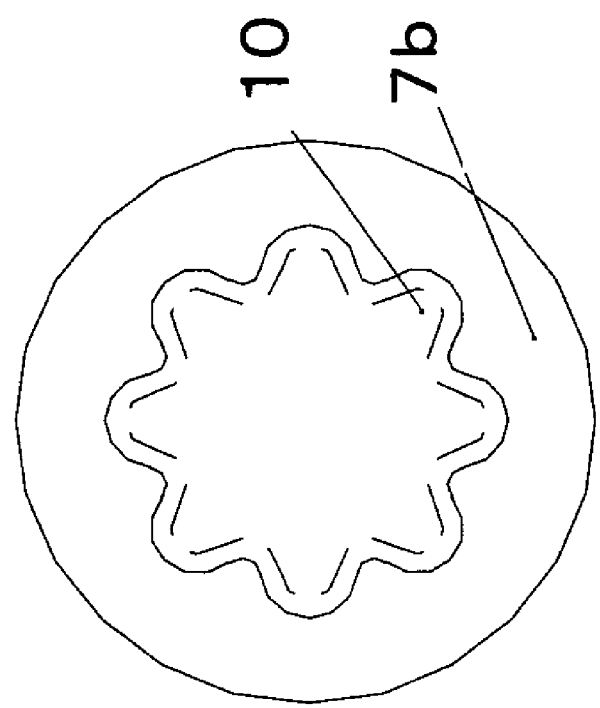
FIG. 10 is a plan view showing a projection on a land according to a ninth embodiment of the invention prior to external terminal mounting.

A projection 10 shown in FIG. 10 as the ninth embodiment is formed to have a shape that many directions of the length of its top surface radiate, and its widths vary partway. Since the top surface of the projection 10 has no orientation, the projection 10 can be formed irrespective of the position of the land in the semiconductor device, and the area of its overhang, which has resistance to the direction of external terminal disconnection, is increased. As a result, the junction strength of the land portion 7b and the external terminal is increased, so that the external terminal disconnection can be prevented.

Figure 11:
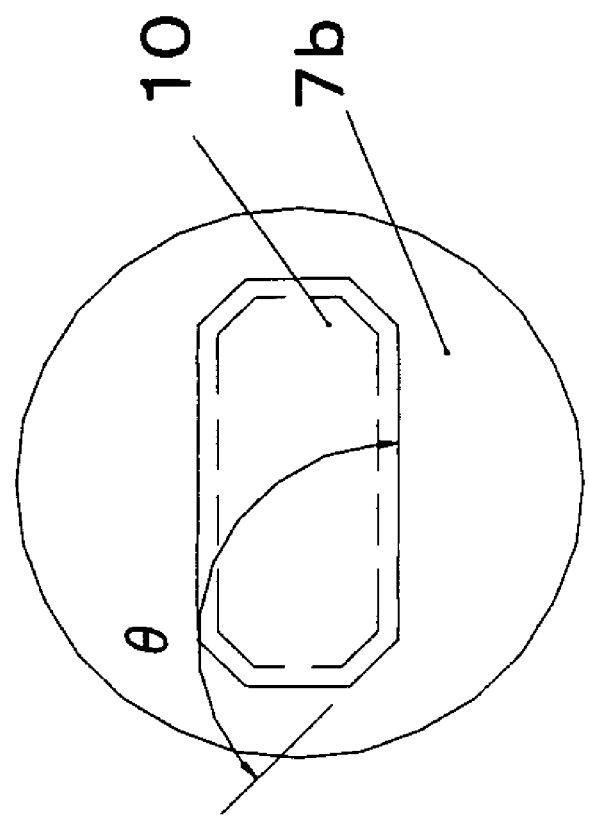
FIG. 11 is a plan view showing a projection on a land according to a tenth embodiment of the invention prior to external terminal mounting.

A projection 10 shown in FIG. 11 as the tenth embodiment has a chamfered top surface whose corners are angled at 120° or more. Since the edge of the corners is eliminated, stress concentration to the external terminals is relieved, so that the crack and disconnection of the external terminal can be prevented. As described in FIGS. 3, 4, and 6 to 10, the corners may be rounded.

In each embodiment described above, the top surface of the projection 10 provided on the top surface of the land portion does not lie off or make contact with the perimeter of the land portion 7b or of the resist opening on the land portion 7b, that is, the projection 10 is formed inside the perimeter of the land portion 7b or the resist opening on the land portion 7b, so that the projection 10 is surrounded with a material of which the external terminal is made. Since the entire perimeter of the projection 10 is caught by the material of which the external terminal is made, the deformation, cracks, and disconnection of the external terminal which start from the projection 10 can be prevented.

In the following, the invention will be described more specifically.

FIGS. 12 to 15 are sectional views showing an embodiment of a method for manufacturing the semiconductor device of the invention in accordance with manufacturing process. This embodiment is described in connection with the method for manufacturing the semiconductor device according to the second embodiment. As shown in FIGS. 12A and 12B, an evaporated metal layer 5 is formed on the entire surface of a semiconductor element 1, on which an insulating resin layer 4 is patterned, by anisotropic vapor deposition such as sputtering. At this time, a metal barrier is initially formed as the evaporated metal layer 5, and then, subsequently, a plating seed layer is formed under vacuum. Also, prior to sputtering, the surface of the insulating resin layer 4 is finely roughened by plasma treatment to improve the adhesion strength of the insulating resin layer 4 and the metal barrier.

The surface of the insulating resin layer 4 is partly incinerated and removed by plasma treatment, and the resin residue which has stuck to the surface of a semiconductor element electrode 2 is also removed. On account of this, it is essential only that methods used for plasma treatment and reactant gases be able to selectively etch the resin of the insulating resin layer 4 in relation to the semiconductor element electrodes 2 and a passivation film 3; in this case, RIE (Reactive Ion Etching) treatment and $O_2$ gas, $N_2$ gas, or a mixed gas of $O_2$ gas and $CF_4$ gas are used.

As to the metal barrier, a metal, such as chromium, is used which has a strong adhesion strength to the insulating resin layer 4, the semiconductor element electrode 2, and the passivation film 3 and which has barrier properties to the etchant for the plating seed layer. As to the plating seed layer, it is necessary to use a metal exhibiting a low resistivity during electroplating, so that copper is used generally. The thickness of the metal barrier used is of the order of 0.1 to 0.2 μm in view of the barrier properties of the plating seed layer to the etchant, and the thickness of the plating seed layer used is of the order of 0.2 to 0.5 μm in view of electric resistance, deposition stress, and ease of etching. Then a photosensitive resist material is applied onto the plating seed layer, after which a plating resist 6a is formed by drying, exposing, and developing the photosensitive resist material (see FIG. 12C). Thereafter, the development residue of the plating resist 6a is removed by plasma treatment using $O_2$ gas.

Figure 13A:
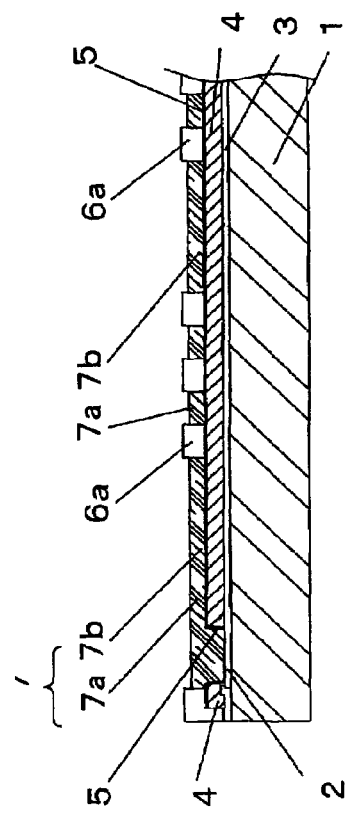
FIGS. 13A to 13C are sectional views showing an embodiment of a method for manufacturing a semiconductor device of the invention by manufacturing process.
Figure 13B:
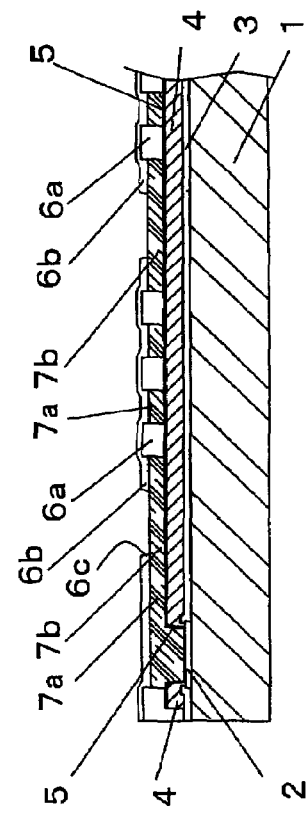

Then openings are made in the plating resist 6a by copper-electroplating, and a thick-film metal layer 7 is selectively formed on portions where the seed layer is exposed (see FIG. 13A). The thick-film metal layer 7 acts as a metal wire 7a and a land portion 7b. The thick-film metal layer 7 is formed so as to have a thickness of the order of 5 to 11 μm in view of its electric resistance, mechanical strength, and productivity.

Figure 16:
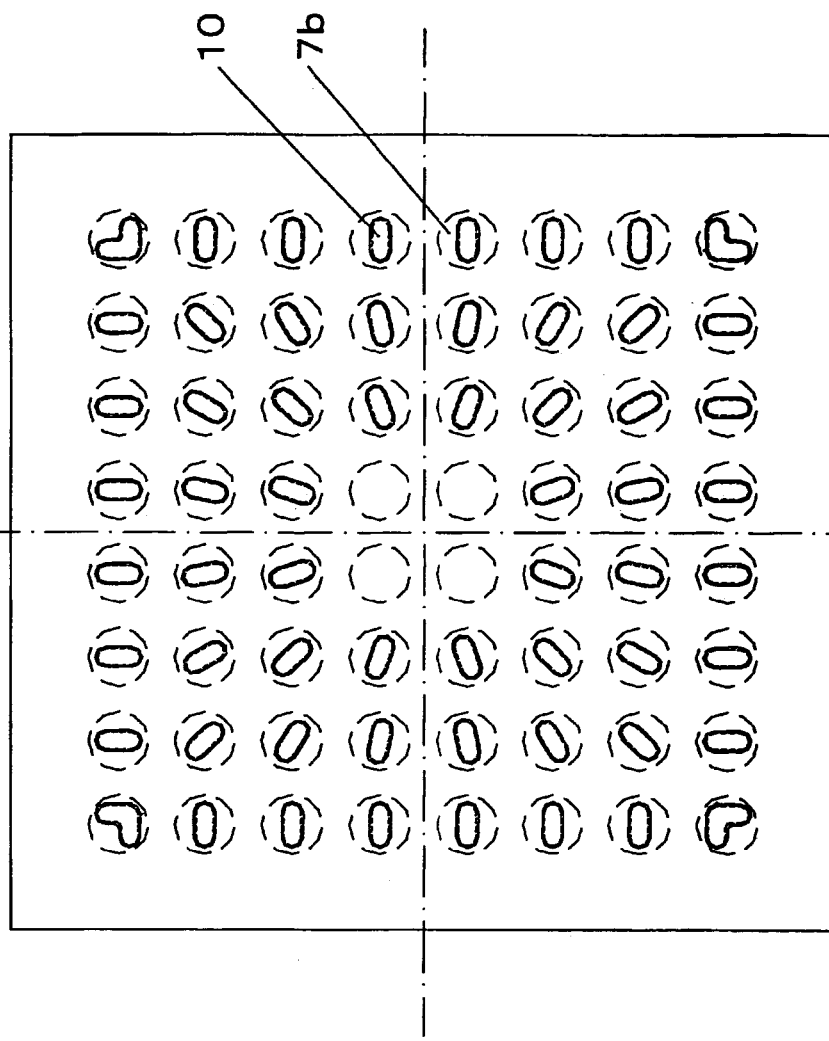
FIG. 16 is a plan view showing a state after plating resist formation of a semiconductor device according to an embodiment of a method for manufacturing a semiconductor device of the invention.

Then another photosensitive resist material is applied. Thereafter, by drying, exposing, and developing the photosensitive resist material, a plating resist 6b is formed so as to have an opening in a portion on at least one metal land portion 7b (see FIG. 13B). At this time, in order to form plating resist openings 6c having a forward-tapered side, a positive photosensitive resin is used as the plating resist 6b, and its drying and exposure conditions are properly set. FIG. 16 illustrates an opening pattern of the plating resist 6b. The opening pattern is formed by making openings in the plating resist 6b through the use of an exposure mask having portions where nickel-plating is not carried out in advance so as to let light pass through only desired resist openings. The projection on the outermost lands are formed so as to have a shape that the direction of the length of its top surface is perpendicular to the perimeter of the semiconductor device, and the projection on the lands located at the outermost corners are formed so as to have a L-shaped top surface whose two directions of the length are perpendicular to the two adjacent sides of the semiconductor device to increase a strength to external forces from the sides of the semiconductor device. The projection on the lands positioned in the second and third lines from the outermost line is formed so as to have a shape that the direction of the length of its top surface radiates from the center of the semiconductor device to increase a strength to the difference in thermal expansion. The lands located in the center portion have no plating resist opening and no projection to bring their strength in balance. Also, in these embodiments, each opening in which the projection is formed has a plane which has no edges but rounded corners R in order to avoid stress concentration generated when connected to the external terminal. Thereafter, the development residue of the plating resist is removed by plasma treatment using $O_2$ gas.

Figure 13C:
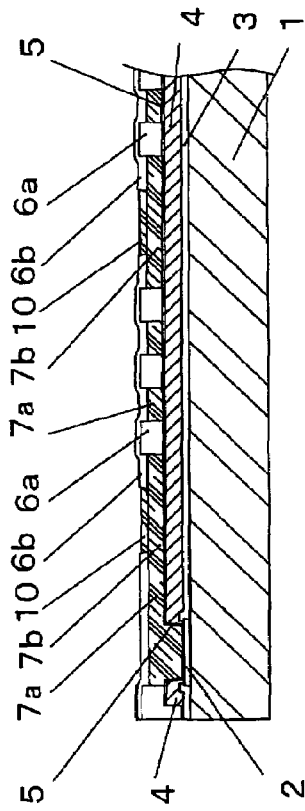

Next, a metal layer is formed selectively on the portions where the openings are made in the plating resist 6b by copper-electroplating and the metal land portions 7b are exposed (see FIG. 13C). The metal layer acts as the projection 10 on the land portion 7b. The side of the projection 10 is formed so as to have a reverse-tapered shape since the side shape of the opening of the plating resist 6b is transferred. After the formation of the projection 10, the plating resist 6b is removed by exfoliation, and then the exfoliated residue of the plating resist 6b is removed by plasma treatment using $O_2$ plasma (see FIG. 14A).

Then, when the entire surface of the seed layer and the thick-film metal layer 7 is etched by a copper etchant, the copper of the seed layer which is thinner than the thick-film metal layer 7 is first removed (see FIG. 14B). At this time, as to the etchant used for etching the seed layer, a solution is used which is capable of selectively etching the seed layer without melting the metal barrier. Further, the metal wires 7a having a desired pattern and the metal lands 7b are formed by etching the entire surface of the metal barrier.

Still further, a photosensitive resin is applied onto the insulating resin layer 4 and the thick-film metal layer 7, after which the resin is dried and exposed. Then the photosensitive resin on the lands 7b and other portions where no photosensitive resin is required is developed and removed, after which the remaining resin is cured to form a solder resist layer 8 (see FIG. 14C).

Figure 15:
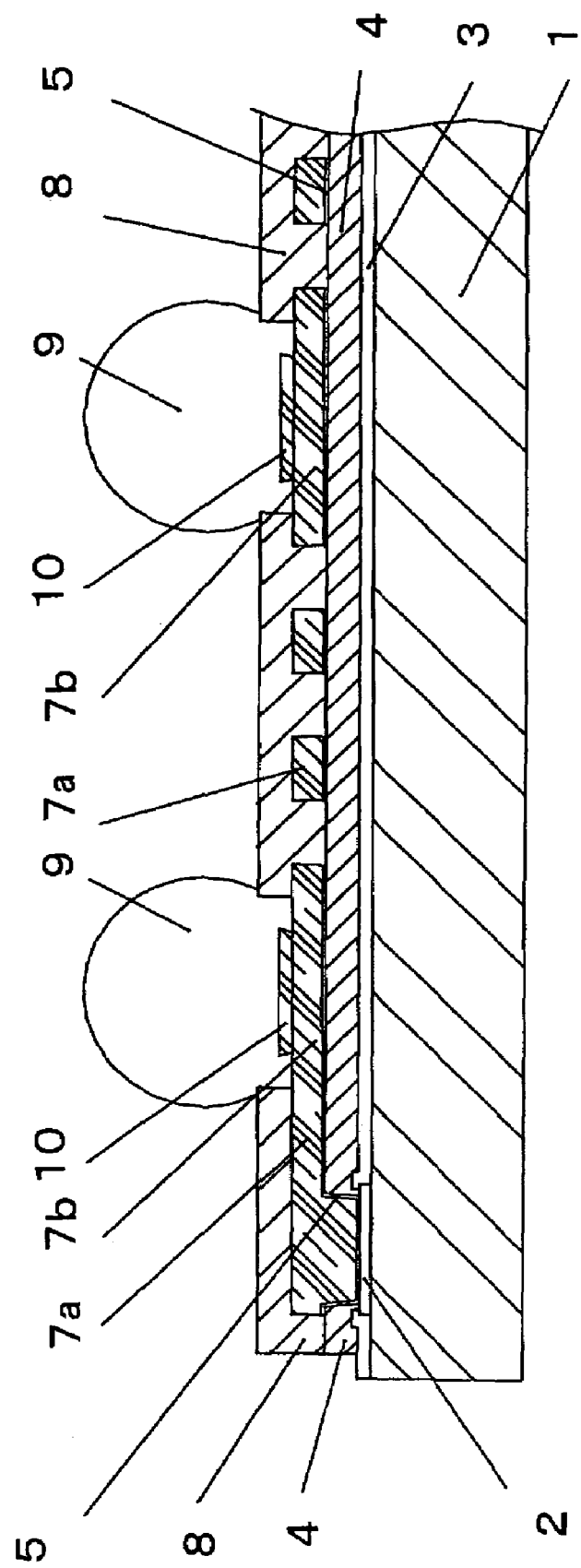
FIG. 15 is a sectional view showing an embodiment of a method for manufacturing a semiconductor device of the invention.

Thereafter, a solder paste is print-melted on the metal lands 7b to form external terminals 9 (see FIG. 15). At this time, the external terminals 9 may be formed by mount-melting low-melting metal balls instead of print-melting the solder paste. As to the plating process in which the projections are formed, the projection may be formed so as to have a shape that its upper portion overhangs its lower portion by depositing the metal by means of plating to the extent that the projection becomes thicker than the plating resist. In order to explain the method for forming the projection, FIG. 18A illustrates a state after the plating process, and FIG. 18B illustrates a state after the resist exfoliation. In this case, as to the taper's direction of the side of the plating resist openings, either direction will do.

Figure 17A:
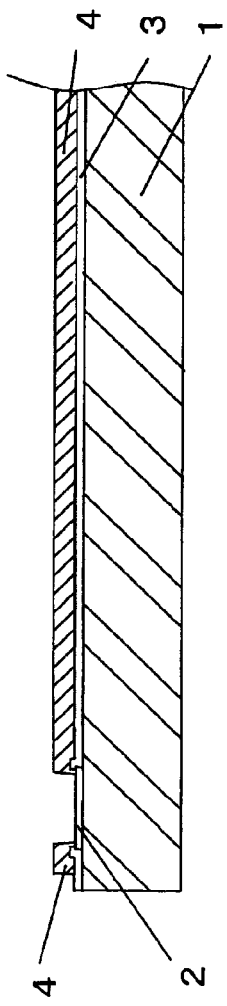
FIGS. 17A to 17C are sectional views showing another embodiment of a method for manufacturing a semiconductor device of the invention.
Figure 17B:
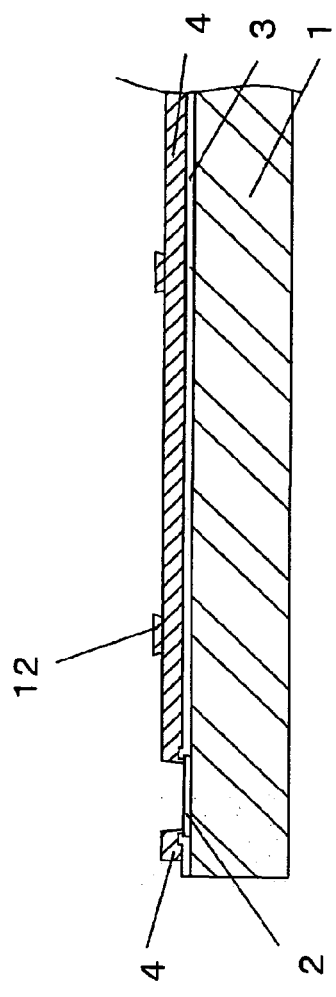
Figure 17C:
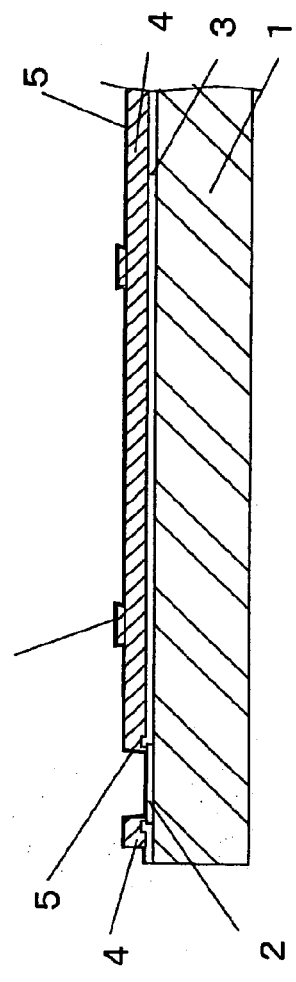

FIGS. 17A, 17B, and 17C are sectional views showing another embodiment of the method for manufacturing the semiconductor device of the invention in accordance with each process. This embodiment will be described in association with the semiconductor device of the fifth embodiment. As shown in FIGS. 17A and 17B, resin projections 12 are formed by laminating another resin film on the resin of at least a part of the resin portions, on which lands are formed at a later process, of a semiconductor element 1 on which an insulating resin layer 4 has been patterned. At this time, in order to make the resin projection 12 have a reverse-tapered side, a negative photosensitive resin is used, and its conditions for drying, exposure, development, and post-curing are properly defined. Then a metal layer 5 is formed by electroless plating (see FIG. 17C). The metal layer 5 functions as a seed layer used at an electroplating process. Also, prior to electroless plating, the surface in which the insulating resin layer 4 is exposed is finely roughened by plasma treatment to improve the adhesion strength of the insulating resin layer 4 and the metal barrier.

The surface of the insulating resin layer 4 is partly incinerated and removed by the plasma treatment, and the resin residue which has stuck to the surface of a semiconductor element electrode 2 is also removed. On account of this, it is essential only that methods used for plasma treatment and reactant gases be able to selectively etch the resin of the insulating resin layer 4 in relation to semiconductor element electrodes 2 and a passivation film 3; in this case, RIE(Reactive Ion Etching) treatment and $O_2$ gas, $N_2$ gas, or a mixed gas of $O_2$ gas and $CF_4$ gas are used.

The next plating resist forming process and the other remaining process are omitted since they are the same as conventional ones. However, by forming land portions on the resin projections 12 at the metal deposition and plating process for the formation of the metal wires, a projection is partly formed in the land portion.

In each embodiment of the methods for manufacturing the semiconductor device of the invention, surface treated layers 11 may be formed by depositing nickel plating, gold plating or the like in the resist openings on the land portions 7b by means of electroplating or electroless plating after the formation of the solder resist 8 (see FIGS. 19A and 19B). The adoption of nickel plating aims to prevent the formation of a brittle alloy layer caused by the diffusion of a metallic material of the external terminal soldered and a metallic material of which the land is made, and the adoption of gold plating aims to prevent reduction in adhesion strength during soldering caused by the oxidation of the land surface.

According to this configuration, since the projection of the land has a mechanical resistance to the disconnection direction of the external terminal by giving the projection a shape that its upper portion overhangs its lower portion or a reverse-tapered side, the junction strength of the external terminal to the land is increased. As a result, the cracks at their junction interface and the disconnection of the external terminal can be surely prevented and a semiconductor device capable of ensuring connection reliability over an extended period of time can be therefore implemented.

Although WLCSPs have been exemplified as the embodiments, by laminating in predetermined form an insulating resin layer, a metal layer, and a solder resist on a substrate of a BGA or the like instead of a wafer, a substrate for BGAs having lands on which projections are formed can be fabricated just as in the case of WLCPSs.

What is claimed is:

1. A semiconductor device, wherein:
an insulating resin layer which insulates metal wires from one another is formed on a semiconductor element,
an end portion of the metal wire is connected to an electrode on the semiconductor element,
the other end portion of the metal wire is connected to an external terminal to form a land,
the entire surface of the semiconductor element except the connecting portions of the lands is covered with a surface-layer resin layer,
a projection is provided on the top surface of at least one of the lands, and
the projection provided on the top surface of the land portion has a shape that at least a part of its upper portion overhangs its lower portion.

2. A semiconductor device, wherein:
an insulating resin layer which insulates metal wires from one another is formed on a semiconductor element,
an end portion of the metal wire is connected to an electrode on the semiconductor element,
the other end portion of the metal wire is connected to an external terminal to form a land,
the entire surface of the semiconductor element except the connecting portions of the lands is covered with a surface-layer resin layer,
a projection is provided on the top surface of at least one of the lands, and
the projection provided on the top surface of the land portion has a shape that at least a part of its side has a reverse-tapered shape.

3. The semiconductor device of claim 1 or 2, wherein the projection provided on the top surface of the land portion has a top surface in which the direction of its length is perpendicular to the perimeter of the semiconductor device being close to the land portion.

4. The semiconductor device of claim 1 or 2, wherein the projection provided on the top surface of the land portion has a top surface in which a longitudinal axis along the direction of its length radiates from the center of the top surface of the semiconductor device.

5. The semiconductor device of claim 1 or 2, wherein the projection provided on the top surface of at least one of the lands located on the diagonal lines of the semiconductor device has a cross-shaped or L-shaped top surface in which the two directions of its length are perpendicular to the perimeter of the semiconductor device being close to the land portion.

6. The semiconductor device of claim 1 or 2, wherein the lands are positioned in plural lines inside the vicinity of the perimeter of the semiconductor device, the projection is provided on the top surface of the land portions positioned in at least a first line from the outermost line, and no projection is provided on the land portions positioned in at least a first line from the inmost line.

7. The semiconductor device of claim 1 or 2, wherein the plural projections are arranged on the top surface of the land portion, and the direction of the length of their top surfaces is perpendicular to the perimeter of the semiconductor device being close to the land portion.

8. The semiconductor device of claim 1 or 2, wherein the plural projections are arranged on the top surface of the land portion, and the direction of length of their top surfaces radiates from the center of the top surface of the semiconductor device.

9. The semiconductor device of claim 1 or 2, wherein the projection provided on the top surface of the land portion has a shape that the direction of the length of its top surface is perpendicular to the perimeter of the semiconductor device being close to the land portion, and the short width of its top surface varies partway.

10. The semiconductor device of claim 1 or 2, wherein the projection provided on the top surface of the land portion has a shape that the direction of the length of its top surface radiates from the center of the top surface of the semiconductor device, and the short width of the top surface of the projection varies partway.

11. The semiconductor device of claim 1 or 2, wherein the projection provided on the top surface of the land portion has a crossshaped top surface having two directions of its length which are perpendicular to the perimeter of the semiconductor device being close to the land portion, and the short width of its top surface varies partway.

12. The semiconductor device of claim 1 or 2, wherein the projection provided on the top surface of the land portion has a shape that many directions of the length of its top surface radiate, and the short widths of its top surface vary partway.

13. The semiconductor device of claim 1 or 2, wherein the projection provided on the top surface of the land portion has a top surface whose corners are chamfered so as to have angles of at least 120° or are rounded.

14. The semiconductor device of claim 1 or 2, wherein the top surface of the projection provided on the top surface of the land portion does not stick out from or contact the perimeter of the land portion or a resist opening on the land portion, and the projection is formed inside the perimeter of the land portion or the resist opening on the land portion.

* * * * *